(12) United States Patent
Yukawa et al.

(10) Patent No.: US 11,007,558 B2
(45) Date of Patent: May 18, 2021

(54) DIAMOND DIE

(71) Applicants: SUMITOMO ELECTRIC HARDMETAL CORP., Itami (JP); Sumitomo Electric Industries, Ltd., Osaka (JP); A.L.M.T. Corp., Tokyo (JP)

(72) Inventors: Makoto Yukawa, Sumoto (JP); Bunya Suemitsu, Sumoto (JP); Takuya Kinoshita, Sumoto (JP); Shigetoshi Sumimoto, Sumoto (JP); Yutaka Kobayashi, Itami (JP); Akihiko Ueda, Itami (JP); Natsuo Tatsumi, Itami (JP); Yoshiki Nishibayashi, Itami (JP); Hitoshi Sumiya, Itami (JP)

(73) Assignees: Sumitomo Electric Hardmetal Corp., Itami (JP); Sumitomo Electric Industries, Ltd., Osaka (JP); A.L.M.T. Corp., Tokyo (JP)

( * ) Notice: Subject to any disclaimer, the term of this patent is extended or adjusted under 35 U.S.C. 154(b) by 294 days.

(21) Appl. No.: 15/745,849

(22) PCT Filed: Jul. 22, 2016

(86) PCT No.: PCT/JP2016/071600
§ 371 (c)(1),
(2) Date: Jan. 18, 2018

(87) PCT Pub. No.: WO2017/014309
PCT Pub. Date: Jan. 26, 2017

(65) Prior Publication Data
US 2018/0207697 A1    Jul. 26, 2018

(30) Foreign Application Priority Data

Jul. 22, 2015  (JP) .............................. JP2015-145027

(51) Int. Cl.
*C23C 16/27* (2006.01)
*C30B 29/04* (2006.01)
(Continued)

(52) U.S. Cl.
CPC ................ *B21C 3/025* (2013.01); *B21C 3/02* (2013.01); *C23C 16/27* (2013.01); *C30B 25/105* (2013.01); *C30B 25/20* (2013.01); *C30B 29/04* (2013.01)

(58) Field of Classification Search
CPC .. B21C 3/025; B21C 3/02; B21C 3/00; B21C 3/04; B21C 3/06; C30B 25/105; C30B 25/20; C30B 29/04
(Continued)

(56) References Cited

U.S. PATENT DOCUMENTS 5,560,241 A   10/1996   Satoh et al.
5,571,236 A   11/1996   Takahashi et al.
(Continued)

FOREIGN PATENT DOCUMENTS

CN   1771356 A    5/2006
CN   101443476 A  5/2009
(Continued)

OTHER PUBLICATIONS

Kenji, JP 2002102917, Translated Dec. 23, 2019 (Year: 2002).*
Extended European Search Report dated Jan. 23, 2019 in the counterpart application No. EP 16827869.

*Primary Examiner* — Debra M Sullivan
*Assistant Examiner* — Matthew Kresse
(74) *Attorney, Agent, or Firm* — Baker Botts L.L.P.; Michael A. Sartori

(57) ABSTRACT

A diamond die includes a diamond provided with a hole for drawing a wire material, the diamond being a CVD single-
(Continued)

crystal diamond, an axis of the hole being inclined relative to a normal direction of a crystal plane of the diamond.

11 Claims, 17 Drawing Sheets

(51) Int. Cl.
    *C30B 25/20*     (2006.01)
    *B21C 3/02*     (2006.01)
    *C30B 25/10*     (2006.01)

(58) Field of Classification Search
    USPC .......................................................... 72/467
    See application file for complete search history.

(56) References Cited

U.S. PATENT DOCUMENTS

| | | | |
|---|---|---|---|
| 5,636,545 A * | 6/1997 | Anthony | ................ B21C 3/025 |
| | | | 72/467 |
| 5,759,667 A | 6/1998 | Takahashi et al. | |
| 6,007,916 A | 12/1999 | Satoh et al. | |
| 2007/0054124 A1 * | 3/2007 | Gill | ....................... C30B 25/105 |
| | | | 428/408 |
| 2009/0127506 A1 | 5/2009 | Twitchen et al. | |
| 2017/0158514 A1 | 6/2017 | Tatsumi et al. | |

FOREIGN PATENT DOCUMENTS

| | | | |
|---|---|---|---|
| CN | 101547757 A | | 9/2009 |
| EP | 1 599 621 A1 | | 11/2005 |
| EP | 1 957 689 A2 | | 8/2008 |
| JP | S59-229227 A | | 12/1984 |
| JP | H02-268917 A | | 11/1990 |
| JP | H04-127913 A | | 4/1992 |
| JP | H06-170435 A | | 6/1994 |
| JP | 2002-102917 A | | 4/2002 |
| JP | 2006-518699 A | | 8/2006 |
| JP | 2009-518273 A | | 5/2009 |
| WO | 2004074557 A1 | | 9/2004 |
| WO | 2007066215 A2 | | 6/2007 |
| WO | 2016/013588 A1 | | 1/2016 |

\* cited by examiner

FIG.7
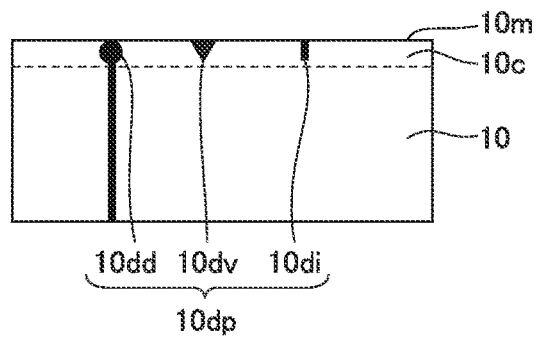
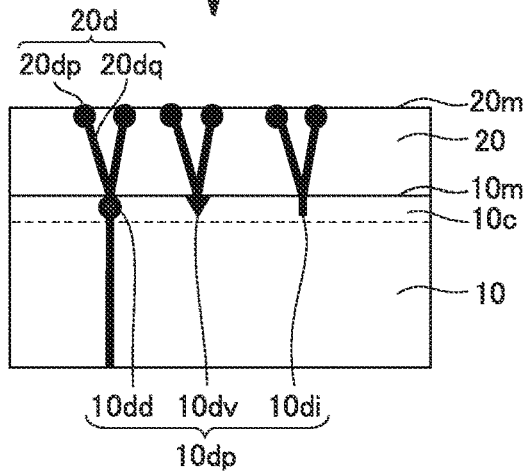
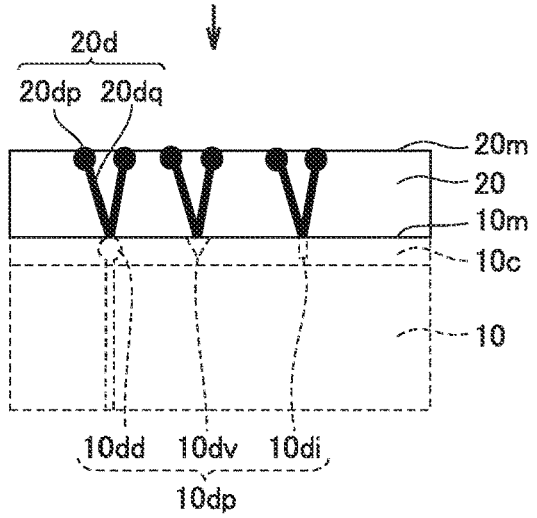
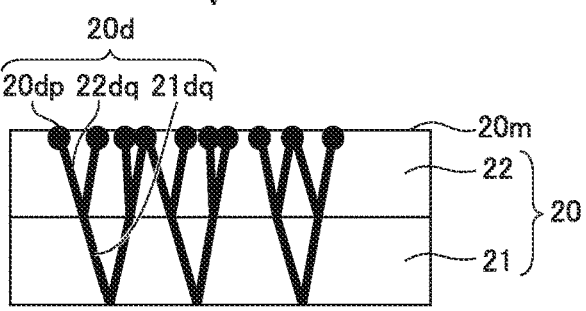

DIAMOND DIE

TECHNICAL FIELD

The present application claims a priority based on Japanese Patent Application No. 2015-145027 filed on Jul. 22, 2015, the entire content of which is incorporated herein by reference. The present invention relates to a diamond die.

BACKGROUND ART

Conventionally, dies are disclosed in Patent Documents 1 to 4.

CITATION LIST

Patent Document

PTD 1: Japanese Patent Laying-Open No. 2002-102917
PTD 2: Japanese Patent Laying-Open No. 4-127913
PTD 3: Japanese Patent Laying-Open No. 6-170435
PTD 4: Japanese National Patent Publication No. 2006-518699

SUMMARY OF INVENTION

Technical Problem

A diamond die according to one embodiment of the present disclosure includes a diamond provided with a hole for drawing a wire material, the diamond being a CVD single-crystal diamond, an axis of the hole being inclined relative to a normal direction of a crystal plane of the diamond.

BRIEF DESCRIPTION OF DRAWINGS

FIG. 7 shows crystal defects of diamond seed crystal 10 and single-crystal diamond 20.

DESCRIPTION OF EMBODIMENTS

Figure 1:
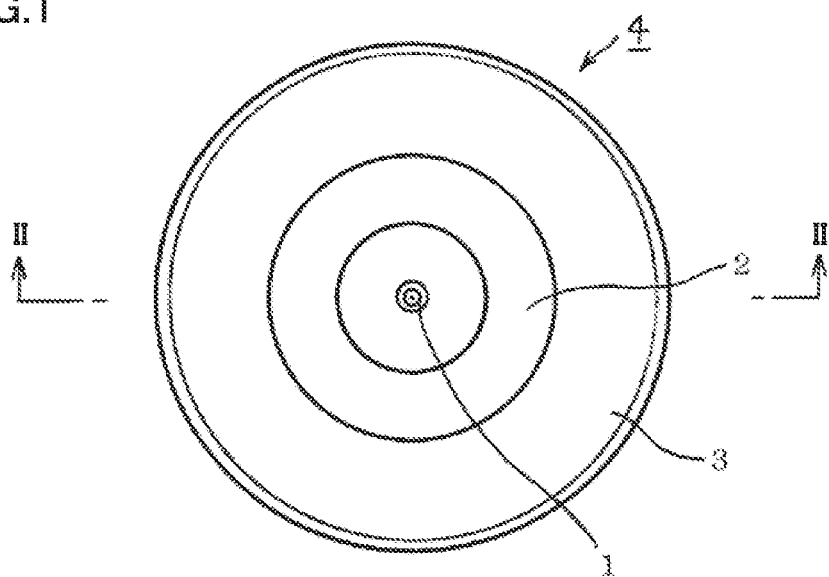
FIG. 1 is a plan view of a diamond die according to an embodiment of the present invention.

Problem to be Solved by the Present Disclosure

Patent Document 1 describes a die employing a single-crystal diamond. In the case where a natural diamond is used as the single-crystal diamond, a high-quality natural diamond material has not been stably available in recent years, disadvantageously. Accordingly, it is considered to use an artificial diamond such as a high-temperature/high-pressure synthesis diamond; however, a diamond die employing such an artificial diamond is worn more greatly in its hole than the diamond die employing the natural diamond, depending on a wire material to be drawn. This may lead to a short life thereof. Moreover, in the case of the single-crystal diamond die, depending on a setting of a crystal orientation, the wear in the hole is facilitated or partial wear therein is more likely to occur. Occurrence of such phenomena may lead to the short life of the die.

Meanwhile, there is also a diamond die employing a diamond sintered material that is a polycrystal diamond; however, in this case, a surface roughness of a wire material becomes deteriorated as compared with a case of using a die employing a single-crystal diamond. Hence, such a diamond die employing a diamond sintered material is currently hardly used in a field that requires quality of wire materials.

In order to solve such a problem, it has been considered to use diamond dies employing CVD diamonds described in Patent Documents 2 to 4.

However, use of each of the diamond dies described in Patent Documents 2 to 4 does not ensure to readily obtain a diamond die having a long life and allowing for an excellent surface roughness of a drawn wire material. Moreover, Patent Document 3 shows an exemplary hole shape, which is not necessarily a preferable shape.

Moreover, in Patent Document 4, the inner surface of the die, i.e., the surface of the hole is a wear surface. It is described that in order to reduce a wear rate of the wear surface, this surface is configured to have various crystal planes, such as a (100) plane, a (113) plane, a (111) plane, and a (110) plane. In the case of a general die provided with a hole having a circular cross sectional shape, a state of wear is changed depending on a set crystal plane as described above. Accordingly, it is considered that wear cannot be reduced stably, which may cause a trouble such as a deteriorated surface roughness of the wire material or disconnection thereof during the wire drawing due to removal of a portion in the hole.

From the description above, the present disclosure is to propose a diamond die that can improve quality of a wire material and prevent disconnection thereof during wire drawing by stably increasing a life of a high-precision diamond die.

Description of Embodiments of the Present Invention

First, embodiments of the invention of the present application are listed and described.

A diamond die according to one embodiment of the present disclosure includes a diamond provided with a hole for drawing a wire material, the diamond being a CVD single-crystal diamond, an axis of the hole being inclined relative to a normal direction of a crystal plane of the diamond.

Since the axis of the hole formed in the diamond is thus inclined relative to the normal direction of the crystal plane of the diamond, a cleavage plane is inclined relative to stress applied from the wire material to the reduction portion or the bearing portion in the axial direction of the hole during wire drawing, with the result that the diamond is less likely to be cloven and a portion in the hole is less likely to be removed.

The above-described effect becomes remarkable when the axis of the hole formed in the diamond is preferably inclined relative to the normal direction of the crystal plane of the diamond by 0.1° to 15°, more preferably 1° to 8°, further preferably 1° to 5°. Moreover, since control for inclining the crystal plane can be performed readily by using the CVD single-crystal diamond material, there is obtained an effect that cannot be obtained using a natural diamond or a high-temperature/high-pressure synthesis diamond.

The following describes a reason why the control for inclining the crystal plane can be performed readily by using the CVD single-crystal diamond material.

A CVD single-crystal diamond material is normally obtained by performing homoepitaxial growth on a base substrate composed of a single-crystal diamond and then removing the base substrate.

The single-crystal diamond may be a nature single-crystal diamond, or a single-crystal diamond produced by the high-temperature/high-pressure synthesis (HPHT) method or a chemical vapor deposition (CVD) method. Moreover, types of single-crystal diamonds are distinguished depending on states of mixing of nitrogen, which is an impurity in the single-crystal diamonds. For the base substrate, any type of single-crystal diamond can be used, such as type Ia, type Ib, type IIa, or type IIb. Examples of the homoepitaxial growth method include a microwave plasma CVD method, a hot-filament CVD method, a direct current discharge plasma CVD method, an arc discharge jet CVD method, a high frequency plasma CVD method, and the like, any of which can be used therefor. For the removal from the base substrate, a cut processing method employing laser can be used.

In the homoepitaxial growth, the crystal plane orientation of the base substrate is one of factors that determines quality of the obtained CVD single-crystal diamond material. The (100) plane is a crystal plane of the base substrate that allows for growth in high quality; however, the growth does not necessarily have to be performed using the (100) plane. There is an appropriate crystal plane depending on a gas flow rate, a base substrate temperature, and other growth conditions. For the plane, an off plane is used which is inclined by an angle of less than or equal to 20° relative to the (100) plane.

Hence, when the base substrate in which the crystal plane orientation is controlled precisely as described above is used, the crystal orientation of the CVD single-crystal diamond obtained by the homoepitaxial growth can be readily recognized, thereby facilitating the control for inclining the crystal plane also in machining for the diamond die.

Preferably, in one embodiment of the invention of the present application, upper and lower surfaces of the diamond are surfaces inclined relative to a (110) plane by 0.1° to 15°. The upper and lower surfaces refer to the upper surface and lower surface of the diamond, and the hole of the die extends from the upper surface to the lower surface.

By employing the surface thus inclined, partial wear in the hole is less likely to occur and roundness is also less likely to be deteriorated, thus improving a life. The upper and lower surfaces of the diamond are inclined relative to the (110) plane by more preferably 1° to 8°, and further preferably 1° to 5°.

Preferably, upper and lower surfaces of the diamond are surfaces inclined relative to a (100) plane by 0.1° to 15°.

By employing the surface thus inclined, partial wear in the hole is less likely to occur and roundness is also less likely to be deteriorated, thus improving a life. The upper and lower surfaces of the diamond are inclined relative to the (100) plane by more preferably 1° to 8°, and further preferably 1° to 5°.

Preferably, upper and lower surfaces of the diamond are surfaces inclined relative to a (111) plane by 0.1° to 15°.

By employing such a crystal plane orientation, wear in the hole is suppressed while maintaining the state in which partial wear is less likely to occur, thus obtaining an effect in which the diameter of the hole is less likely to be increased. The upper and lower surfaces of the diamond are inclined relative to the (111) plane by more preferably 1° to 8°, and further preferably 1° to 5°.

Preferably, the hole includes a reduction portion, a bearing portion having a diameter D, a back relief portion, and an exit portion in a direction from an upstream side to a downstream side of flow of the wire material so as to define the hole, and a length of the bearing portion is more than or equal to 0.4 D and less than or equal to 1.5 D in a shape of the hole in a cross section along the axis of the hole.

By increasing the bearing portion to be longer than that in a normal case in this way, wear is less likely to occur even in the die composed of the material of the invention of the present application and having the shape of the invention of the present application, whereby the wear resistance in the hole is improved, roundness is less likely to be changed, and a portion of the bearing portion is less likely to be removed.

Preferably, the diameter D is less than 50 μm, and a cross sectional shape of the hole from the back relief portion to the exit portion is a recessed curve shape.

Such a shape of the hole facilitates swarf to be discharged during the wire drawing, thereby preventing occurrence of partial wear and occurrence of flaws on the wire surface due to the swarf being caught therein.

Preferably, the diamond die is used with an area reduction ratio of more than or equal to 8% and less than or equal to 25% during the wire drawing.

The area reduction ratio is set at more than or equal to 8% because it is required to perform wire drawing efficiently with the above-described shape of the hole, and the area reduction ratio is set at less than or equal to 25% in order to prevent disconnection of the wire due to the resistance becoming too large during the wire drawing. By performing the wire drawing with the above area reduction ratio, the resistance is suppressed effectively during the wire drawing using the diamond die provided with the hole having the above-described shape, thereby achieving an extended life thereof and preventing disconnection thereof during the wire drawing.

Preferably, the diamond die is used for drawing any one of metal wires or wires in which various types of metal plating are provided to the metal wires, the metal wires including a copper-based metal wire, an iron-based metal wire, a gold wire, a silver wire, a brass wire, an aluminum wire, an aluminum alloy wire, and a tungsten wire.

In the wire drawing of such a wire material, the use of the above-described diamond die can lead to slow wear rate, effective suppression of partial wear, and an extended life thereof, while the drawn wire material can be finished to have high quality.

In order to effectively exhibit such characteristics of the diamond die, it is preferable to use a CVD single-crystal diamond having the following characteristics. In the single-crystal diamond, in an X-ray topography image for a crystal growth main surface of the single-crystal diamond, a group of crystal defect points are gathered, each of the crystal defect points being a tip point of a crystal defect line reaching the crystal growth main surface, the crystal defect line representing a line in which a crystal defect exists.

Preferably, the crystal plane of the diamond is one of a (110) plane, a (100) plane and a (111) plane. In this case, it is possible to suppress wear of the diamond die securely.

According to the diamond die of the invention of the present application, the life thereof and the quality of the drawn wire material can be improved without increasing cost of the diamond die, thus allowing for wire drawing in which disconnection is less likely to occur.

The following describes an embodiment according to one aspect of the invention of the present application with reference to figures.

Figure 2:
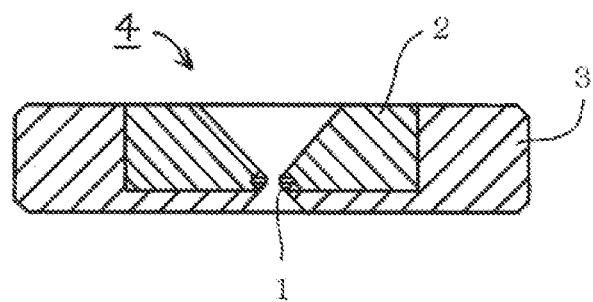
FIG. 2 is a cross sectional view along an II-II line in FIG. 1.

FIG. 1 is a plan view of a diamond die according to the embodiment of the present invention. FIG. 2 is a cross sectional view along an II-II line in FIG. 1. With reference to FIG. 1 and FIG. 2, a diamond die 4 includes: a diamond 1 located at the center of diamond die 4; a sintered alloy 2 provided around diamond 1 to hold diamond 1; and a case 3 that holds sintered alloy 2.

Diamond 1 is fixed to and engaged with sintered alloy 2. Diamond 1 is a diamond single-crystal material composed of a CVD diamond synthesized by chemical vapor deposition, and is polished to have a shape of plate with a certain thickness.

Figure 3:
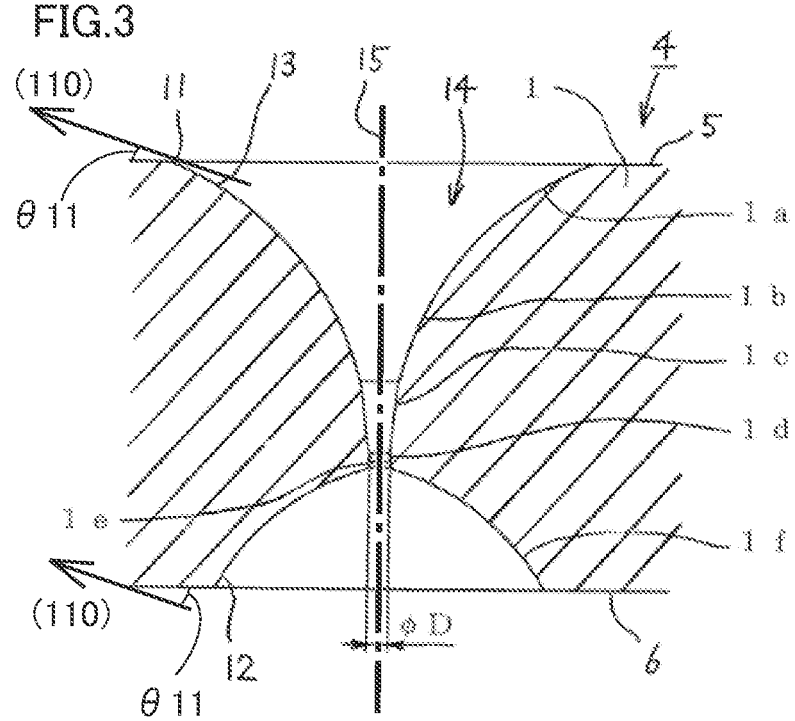
FIG. 3 is an enlarged cross sectional view showing a diamond in FIG. 2.

FIG. 3 is an enlarged cross sectional view showing the diamond in FIG. 2. With reference to FIG. 3, diamond 1 has an inlet 11 and an outlet 12, and is provided with a hole 14 extending from inlet 11 to outlet 12. Further, from the inlet 11 side, diamond 1 has a bell portion 1*a*, an approach portion 1*b*, a reduction portion 1*c*, a bearing portion 1*d*, a back relief portion 1*e*, and an exit portion 1*f*. Hole 14 provided in diamond 1 permits a wire material to be inserted from the inlet 11 side and drawn to the outlet 12 side.

Inclination of a side wall 13 is changed gradually relative to an axis 15 serving as a center axis. It should be noted that in the cross section shown in FIG. 3, hole 14 is configured to have a shape symmetrical relative to axis 15. The diameter of the hole becomes smaller as it is closer to bearing portion 1*d*. Further, the inclination of side wall 13 that defines hole 14 becomes smaller as it is closer to bearing portion 1*d*, and an angle between side wall 13 and axis 15 becomes smaller as it is closer to bearing portion 1*d*. A curved surface constituting a boundary portion between bearing portion 1*d* and reduction portion 1*c* is constituted of a combination of smooth curves. Assuming that the inner diameter of hole 14 in bearing portion 1*d* is D, the length of the bearing portion is more than or equal to 0.4 D and less than or equal to 1.5 D in a cross section (cross section in FIG. 2) appearing when diamond die 4 is cut along a plane including axis 15 and parallel to axis 15. Back relief portion 1*e* is provided to be continuous to bearing portion 1*d* and have a larger hole diameter. Further, at the outlet 12 side, exit portion 1*f* is provided to have a recessed curve shape.

In diamond 1, an upper surface 5 perpendicular to axis 15 is provided at the inlet 11 side, and a lower surface 6 perpendicular to axis 15 is provided at the outlet 12 side. Each of upper surface 5 and lower surface 6 is constituted of a plane inclined relative to a (110) plane by an angle θ11 of 0.1° to 15°. A crystal orientation in the direction of axis 15 is an orientation with an angle of 0.1° to 15° relative to a <110> direction. Hole 14 extends from upper surface 5 to lower surface 6.

When stress is applied in a direction parallel to the crystal plane of the diamond, cleavage is likely to occur in the crystal plane; however, when the direction in which the stress is applied is inclined only by 0.1° relative to the crystal plane, cleavage is less likely to occur.

In the case of the die, stress is applied in the axial direction to the bearing portion and a portion of the reduction portion with which the wire material is first brought into contact during the wire drawing. At the reduction portion, stress in line contact is applied. At the bearing portion, stress in surface contact is applied.

The bearing portion is a surface parallel to the axial direction. If this surface is parallel to the crystal plane, the (111) plane, which is likely to cause cleavage, appears as weak points in four locations in mirror symmetry and two-fold rotation symmetry (in the case where the axial direction corresponds to <110>), three locations in three-fold rotation symmetry (in the case where the axial direction corresponds to <111>), or four locations in four-fold rotation symmetry (in the case where the axial direction corresponds to <100>). When angled off only by 0.1°, this symmetry is broken to reduce the total number of the weak points, thereby extremely reducing a probability of occurrence of maximum stress in the cleavage plane. Accordingly, cleavage is less likely to occur. Further, when the crystal plane is parallel thereto, the weak points are located at locations corresponding to the axial direction; however, when angled off only by 0.1°, the weak points are deviated greatly forwardly and backwardly (they are deviated more greatly as a curvature in a radial direction is smaller and the deviation becomes comparable to the bearing length). Accordingly, maximum stress points are more likely to be deviated from the weak points. This effect was found to be beneficial to such an extent as to compensate asymmetry of wear. Particularly, when the axial direction of the hole corresponds to the <110> direction, a vector in the stress direction is likely to match the cleavage (111) plane, whereby the effect becomes larger. Moreover, since the wire material surface is brought into surface contact with the bearing surface at the bearing portion, the stress becomes very large.

Therefore, when the bearing portion of the die is inclined only by 0.1° relative to the crystal plane, the effect of preventing the cleavage is increased dramatically.

The above diamond die is used with the diameter of the wire material being selected to attain an area reduction ratio of more than or equal to 8% and less than or equal to 25%. Moreover, the diamond die is used for drawing metal wires, wires in which various types of metal plating are provided to the metal wires, or the like. Examples of the metal wires include a copper-based metal wire, an iron-based metal wire, a gold wire, a silver wire, a brass wire, an aluminum wire, an aluminum alloy wire, and a tungsten wire.

The above-described diamond die provides the effect when drawing various types of wire materials having wire diameters of about 10 μm to 500 μm.

The single-crystal diamond according to the embodiment of the invention of the present application is preferably configured as follows. That is, in an X-ray topography image for the crystal growth main surface of the single-crystal diamond die, groups of crystal defect points are gathered, each of the crystal defect points being a tip point of a crystal defect line reaching the crystal growth main surface, the crystal defect line representing a line in which a crystal defect exists, and a density of the crystal defect points can be more than 2 mm$^{-2}$. Since the density of the crystal defect points is more than 2 mm$^{-2}$ in such a single-crystal diamond, occurrence of large chipping is suppressed due to stress relaxation provided by the crystal defect lines, as compared with a single-crystal diamond having no defect.

The single-crystal diamond of the present embodiment is preferably configured as follows. That is, a density of combined dislocation points of the crystal defect points can be more than 2 mm$^{-2}$, each of the combined dislocation points being a tip point of a combined dislocation reaching the crystal growth main surface, the combined dislocation resulting from a combination of at least either of a plurality of edge dislocations and a plurality of screw dislocations. Since the density of the combined dislocation points, which are the tip points of the combined dislocations reaching the crystal growth main surface, is more than 2 mm$^{-2}$ and the effect of stress relaxation provided by the combined dislocations is large in such a single-crystal diamond, occurrence of large chipping is suppressed further.

The single-crystal diamond of the present embodiment is preferably configured as follows. That is, the single-crystal diamond of the present embodiment can include a plurality of single-crystal diamond layers. Since the single-crystal diamond includes the plurality of single-crystal diamond layers, formation of the crystal defect lines is facilitated, thus further preventing occurrence of large chipping.

Specifically, the single-crystal diamond has such a structure that a crystal defect line of the single-crystal diamond is branched into a plurality of crystal defect lines from a crystal defect point, which is a point reaching a single-crystal diamond layer serving as a boundary. As a result, the structure is such that as the number of the single-crystal diamond layers is increased, the number of the crystal defect lines is increased in the direction toward one main surface.

A single-crystal diamond according to a certain embodiment of the invention of the present application is preferably configured as follows. That is, in an X-ray topography image for a crystal growth main surface of the single-crystal diamond, a plurality of crystal defect line-like gathered regions exist in parallel, and in the plurality of crystal defect line-like gathered regions, groups of crystal defect points are gathered to extend in a form of lines, each of the crystal defect points being a tip point of a crystal defect line reaching the crystal growth main surface, the crystal defect line representing a line in which a crystal defect exists.

The single-crystal diamond of the present embodiment is preferably configured as follows. That is, more than or equal to 1 ppm of nitrogen atoms can be contained as impurity atoms. Such a single-crystal diamond contains more than or equal to 1 ppm of nitrogen atoms as impurity atoms, and the nitrogen atoms are clustered nitrogen atoms providing starting points of chipping or cracking, rather than isolated substitutional nitrogen atoms providing no starting points of chipping or cracking; however, occurrence of large chipping is suppressed due to stress relaxation provided by the multiplicity of crystal defect lines. In order to disrupt progress of chipping, more than or equal to 3 ppm of nitrogen atoms are desirably contained. Further, more than or equal to 30 ppm of nitrogen atoms are more desirably contained. However, if there are too many nitrogen atoms even while the density of the crystal defect lines is high, stress is not relaxed before occurrence of chipping. Hence, the concentration of the nitrogen atoms is desirably less than or equal to 1000 ppm.

The single-crystal diamond of the present embodiment is preferably configured as follows. That is, a transmittance for 400-nm light can be less than or equal to 60% when the thickness of the single-crystal diamond is 500 μm or is converted into 500 μm and the single-crystal diamond is mirror-polished to such an extent that evaluation can be made optically (surface scattering is less than or equal to 2%). Due to a synergetic effect of the defects and the impurity, such a single-crystal diamond absorbs light in the wavelength of less than or equal to 400 nm, thus reducing the transmittance. With this effect, occurrence of large chipping is suppressed.

Details of Embodiment of Single-Crystal Diamond Material

The single-crystal diamond included in the die preferably has the following characteristics. The single-crystal diamond may not have the characteristics.

[Single-Crystal Diamond]

Figure 4:
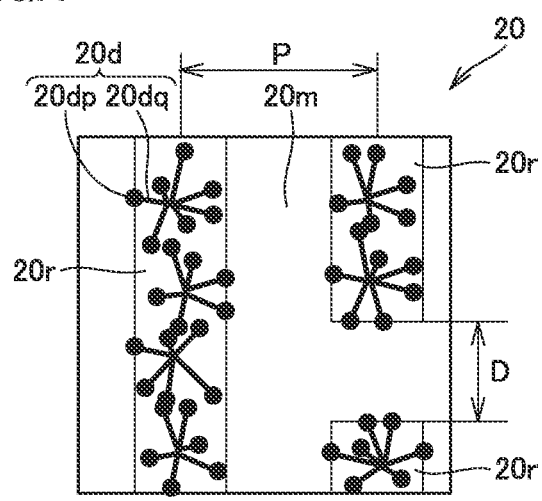
FIG. 4 shows a crystal defect of a single-crystal diamond 20.
Figure 5:
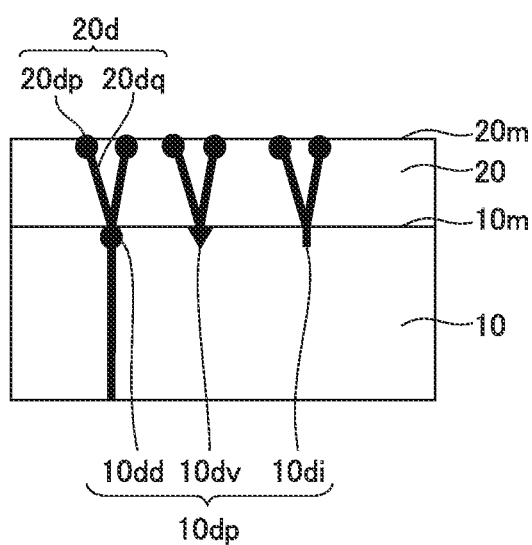
FIG. 5 shows crystal defects of a diamond seed crystal 10 and single-crystal diamond 20.

With reference to FIG. 4 and FIG. 5, in single-crystal diamond 20 of the present embodiment, in an X-ray topography image for a crystal growth main surface 20*m* of single-crystal diamond 20, a group of crystal defect points 20*dp* are gathered, each of crystal defect points 20*dp* being a tip point of a crystal defect line 20*dq* (for example dislocation lines or the like) reaching at least one certain surface of single-crystal diamond 20, crystal defect line 20*dq* representing a line in which a crystal defect 20*d* exists. Here, in the invention of the present application, the expression "groups of defect points are gathered" has a specific meaning as follows. That is, one group of crystal defect points is a collection of a plurality of defect points branched from one starting point or a collection of crystal defect points branched from the foregoing plurality of crystal defect points. A collection of defect points branched from a different starting point is considered as a different group. Therefore, assuming that a minimum circle entirely including one group is expressed as an area of the group, it is expressed that groups are gathered when the area of a certain group is in contact with or overlaps with the area of another group.

In single-crystal diamond material 20 of the present embodiment, existence of crystal defect points 20*dp* and crystal defect lines 20*dq* is indicated in an X-ray topography image. Specifically, since crystal defect points 20*dp* and crystal defect lines 20*dq* have higher X-ray reflection intensities than those of portions other than crystal defect points 20*dp* and crystal defect lines 20*dq* in the crystal (portions with less defects, i.e., portions with high crystallinity), the existence of crystal defect points 20*dp* and crystal defect lines 20*dq* are shown as dark portions in the case of a positive X-ray topography image and are shown as bright portions in the case of a negative X-ray topography image. The crystal defect lines are shown as the dark or bright portions in the form of lines, whereas the crystal defect points are shown as intersections between the surface of the crystal and the crystal defect line.

[Crystal Defect]

Here, crystal defects 20*d* include various types of defects such as point defects, dislocations, chippings, cracks, and crystal strains. Moreover, the dislocations include edge dislocations, screw dislocations, and combined dislocations resulting from combinations of at lease either of a plurality of edge dislocations and a plurality of screw dislocations.

Each of crystal defect lines $20dq$ constituted of these dislocations and the like is stopped when a crystal defect line $20dq$ is newly generated or crystal defect line $20dq$ reaches crystal growth main surface $20m$. The side thereof having reached crystal growth main surface $20m$ is referred to as "crystal defect point $20dp$", and in the invention of the present application, the number of crystal defect points $20dp$ is counted to define a density of crystal defect points $20dp$. Since it is practically impossible to count more than or equal to $10^4$ crystal defect points as in the invention of the present application, an average value of the crystal defect points in at least five locations within a limited range is taken as follows. When there are expected to be less than 10 crystal defect points/mm$^2$, crystal defect points $20dp$ are counted in the whole of the crystal, and the crystal defect points thus counted are divided by the area of the whole of the crystal and are therefore converted into a unit of mm$^{-2}$. Crystal defect points $20dp$ are counted within a region with a limited range such as: a region of 1 mm square when there are expected to be more than or equal to 10 crystal defect points/mm$^2$ and less than 100 crystal defect points/mm$^2$; a region of 500 µm square when there are expected to be more than or equal to $10^2$ crystal defect points/mm$^2$ and less than $5\times10^2$ crystal defects/mm$^2$; a region of 200 µm square when there are expected to be more than or equal to $5\times10^2$ crystal defect points/mm$^2$ and less than $3\times10^3$ crystal defect points/mm$^2$; a region of 140 µm square when there are expected to be more than or equal to $3\times10^3$ crystal defect points/mm$^2$ and less than $10^4$ crystal defect points/mm$^2$; a region of 100 µm square when there are expected to be more than or equal to $10^4$ crystal defect points/mm$^2$ and less than $2\times10^4$ crystal defect points/mm$^2$; or a region of 50 µm square when there are expected to be more than or equal to $2\times10^4$ crystal defect points/mm$^2$. Then, the crystal defect points thus counted are converted into a unit of mm$^{-2}$. In doing so, the region in which the number of crystal defect points $20dp$ is counted must be a region including crystal defect gathered regions $20r$. Crystal defect gathered region $20r$ refers to a region in which groups of crystal defect points $20dp$ are gathered. A crystal defect gathered region $20r$ in the form of a line is referred to as "crystal defect line-like gathered region". If it is unknown which one of the stopped portions of crystal defect line $20dq$ reaches the crystal growth main surface, the crystal defect point is specified by changing incident angle and diffracting plane for a transmission type X-ray topography image or by capturing a reflection type X-ray topography image.

On the other hand, crystal defect line $20dq$ is a crystal defect point $20dp$ at the crystal growth surface, so that the density of crystal defect lines $20dp$ in the vicinity of the crystal growth surface is equal to the density of crystal defect points $20dp$. A crystal defect line $20dq$ exists also inside the crystal and there is an intersection thereof with an arbitrary surface. The density of such intersections corresponds to the density of the crystal defect lines in the surface. Examples of the arbitrary surface include a boundary surface that grows in the form of a layer, and the like.

Each crystal defect gathered region $20r$ is formed by crystal defect points $20dp$, which are the tip points of crystal defect lines $20dq$ and which are gathered in the form of lines at crystal growth main surface $20m$, each of crystal defect lines $20dq$ being a line in which crystal defect $20d$ exists. Therefore, in an X-ray topography image measured in a transmission type in the direction parallel to the crystal growth direction of single-crystal diamond 20 (i.e., direction perpendicular to crystal growth main surface $20m$), crystal defect lines $20dq$ are overlapped in crystal defect gathered region $20r$, with the result that it becomes difficult to discern a state of gathering of crystal defect points $20dp$. Since it is necessary to observe crystal defect points $20dp$ in the invention of the present application, it is preferable to use X rays, which are synchrotron radiation, for the X-ray topography image. For the transmission type, the measurement is performed using X rays with a wavelength of 7.1 nm and (220) diffraction of 2Theta=32.9°, for example. Meanwhile, for the reflection type, the measurement may be performed using X rays with a wavelength of 9.6 nm and (113) diffraction of 2Theta=52.4°. If crystal defect points $20dp$ are not discerned as described above, the crystal defect points are specified by capturing an image in a different wavelength and at a different angle of diffraction. Similarly, the measurement may be performed using an X-ray diffractometer of a laboratory system. For example, the (111) diffraction may be observed using a Mo radiation source or the (113) diffraction may be observed using a Cu radiation source; however, a long measurement time is required to capture an image with high resolution. Although a CCD camera can be used for the measurement, it is desirable to use a nuclear plate to increase resolution. It is desirable to perform all of storage, development, and fixing of the nuclear plate in a cool environment of less than or equal to 10° C. After the development, an image is captured with an optical microscope to quantify crystal defect points $20dp$ and crystal defect lines $20dq$. Although there is also a method (double-refraction method) employing double refraction to measure such crystal defects, some dislocations may not appear in the double-refraction image or point defects that are not structure defects may appear in the double-refraction image. Hence, the X-ray topography is more preferable than the double-refraction method.

In single-crystal diamond 20 of the present embodiment, the density of crystal defect points $20dp$ is more than 2 mm$^{-2}$, is preferably more than 20 mm$^{-2}$, is more preferably more than 300 mm$^{-2}$, is further preferably more than 1000 mm$^{-2}$, and is still more preferably more than $1\times10^4$ mm$^{-2}$. Since the density of crystal defect points $20dp$ is more than 2 mm$^{-2}$ in such a single-crystal diamond material, occurrence of large chipping is suppressed due to stress relaxation provided by the high density of crystal defect lines $20dq$ corresponding to the high density of crystal defect points $20dp$. Particularly, chipping resistance is particularly excellent when the density is more than 1000 mm$^{-2}$.

In single-crystal diamond 20 of the present embodiment, the density of the combined dislocation points of crystal defect points $20dp$ is more than 2 mm$^{-2}$, is preferably more than 20 mm$^{-2}$, is more preferably more than 30 mm$^{-2}$, is further preferably more than 300 mm$^{-2}$, and is still more preferably more than 3000 mm$^{-2}$. Each of the combined dislocation points is a tip point of a combined dislocation reaching the crystal growth main surface, the combined dislocation resulting from a combination of at least either of a plurality of edge dislocations and a plurality of screw dislocations. Since the density of the combined dislocation points, which are the tip points of the combined dislocations reaching the crystal growth main surface, is more than 20 mm$^{-2}$ and the effect of stress relaxation provided by the combined dislocations is large in such a single-crystal diamond, occurrence of large chipping is suppressed further. Particularly when the density is more than 300 mm$^{-2}$, chipping resistance is particularly excellent.

In single-crystal diamond material 20 of the present embodiment, in an X-ray topography image, a plurality of crystal defect gathered regions 20r exist in parallel, and in each of crystal defect gathered regions 20r, groups of crystal defect points 20dp are gathered to extend in the form of lines, each of crystal defect points 20dp being a tip point of a crystal defect line 20dq reaching at least one certain surface of the single-crystal diamond, crystal defect line 20dq representing a line in which the crystal defect exists. The form of lines can be determined based on an abrupt decrease of probability of existence of crystal defect points 20dp on a line rotated by a certain angle (for example, more than or equal to 10° and less than or equal to 90°) from one fixed line having a certain width as compared with probability of existence of crystal defect points 20dp on the fixed line. That is, when at least five lines are extracted and angles and crystal defect points 20dp on lines are plotted in a graph, a peak appears with the fixed line being centered, thereby determining the form of lines.

Here, the combined dislocations can be observed by changing an X-ray diffraction direction (g vector) in the X-ray topography. For example, when observing, in the transmission type, the (001) plane that is a crystal plane of the diamond single crystal, the edge dislocations can be observed in a g vector of a [440] direction and cannot be observed in a g vector of a [4-40] direction or the like orthogonal to the foregoing g vector, whereas the combined dislocations can be observed in a plurality of g vectors of the [440] direction, the [4-40] direction, and the like orthogonal to one another. It should be noted that when observing other dislocations having a Burgers vector that is not perpendicular to the <001> direction, in which the dislocations, i.e., crystal defect lines 20dq extend and that has a component also in the <001> direction, such dislocations can be observed in the reflection type in g vectors of the [044] direction, the [004] direction, the [111] direction, the [113] direction, and the like, for example. However, in the case of the reflection type, the crystal defect lines such as the dislocations are overlapped with one another in the image, with the result that it becomes difficult to discern whether or not the crystal defects are in the form of the structure of the invention of the present application. The measurements and terms herein are described in detail in WO 2016/013588, and are defined the same.

Since the combined dislocations thus observed are also crystal defect lines 20dq, the density of the combined dislocations can be measured in the same manner as the measurement of the density of crystal defect lines 20dq by using the method described above in the section [Crystal Defect].

Figure 6:
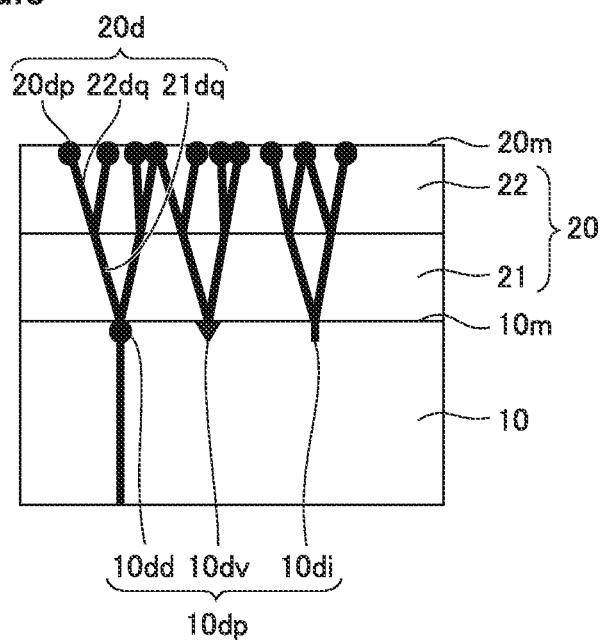
FIG. 6 shows crystal defects of diamond seed crystal 10 and single-crystal diamond 20.

With reference to FIG. 6, single-crystal diamond 20 of the present embodiment preferably includes a plurality of single-crystal diamond layers 21, 22. Since single-crystal diamond 20 includes the plurality of single-crystal diamond layers 21, 22, formation of crystal defect lines 21dp, 22dq is facilitated, thus further suppressing occurrence of large chipping.

First single-crystal diamond layer 21 is grown by CVD on a main surface 10m of a diamond seed crystal 10 having seed crystal defect line-like gathered regions in which groups of seed crystal defect points 10dp are gathered to extend in the form of lines at main surface 10m, and crystal defect lines 21dq transferred from the defects of seed crystal defect points 10dp at main surface 10m extend in first single-crystal diamond layer 21 in the crystal growth direction. In second single-crystal diamond layer 22 grown by CVD on first single-crystal diamond layer 21, crystal defect points 20dp are tip points of crystal defect lines 22dq that have defects transferred from crystal defect lines 21dq and that extend in the crystal growth direction to reach crystal growth main surface 20m of single-crystal diamond 20.

On this occasion, generally, in first single-crystal diamond layer 21, a plurality of crystal defect lines 21dq are transferred from one seed crystal defect point 10dp of diamond seed crystal 10, and in second single-crystal diamond layer 22, a plurality of crystal defect lines 22dq are transferred from one crystal defect line 21dq of first single-crystal diamond layer 21. Hence, as the number of single-crystal diamond layers 21, 22 is increased, the number of crystal defect points 20dp of single-crystal diamond 20 is increased. As a result, single-crystal diamond 20 has such a structure that as the number of single-crystal diamond layers is increased, the number of the crystal defect lines is increased in the direction toward one main surface, whereby a crystal having higher chipping resistance is obtained. Single-crystal diamond 20 of the present embodiment preferably contains more than or equal to 1 ppm of nitrogen atoms as impurity atoms. This single-crystal diamond 20 contains more than or equal to 1 ppm of nitrogen atoms as impurity atoms, and these nitrogen atoms are nitrogen in such a state that the nitrogen atoms are not isolated substitutional nitrogen atoms. The concentration of such a nitrogen impurity can be calculated by subtracting nitrogen measured by ESR (electron spin resonance method) from nitrogen measured by SIMS (secondary ion mass spectrometry method). It was found that the nitrogen thus defined is mixed and is joined to the crystal defect lines in the invention of the present application to suppress occurrence of large chipping, thereby increasing chipping resistance. In view of the above, the concentration of the nitrogen atoms contained as impurity atoms in the single-crystal diamond is more than or equal to 1 ppm, is more preferably more than or equal to 3 ppm, is more preferably more than or equal to 10 ppm, and is further preferably more than or equal to 30 ppm. Particularly, when the concentration is more than or equal to 10 ppm, excellent chipping resistance is exhibited. When groups of crystal defect points 20dp are gathered, a larger amount of non-isolated substitutional nitrogen is more likely to be formed in the diamond to provide high chipping resistance.

In single-crystal diamond 20 of the present embodiment, when the thickness of single-crystal diamond 20 is 500 μm or is converted into 500 μm, a transmittance for 400-nm light is less than or equal to 60%, is preferably less than or equal to 30%, is more preferably less than or equal to 10%, and is still more preferably less than or equal to 5%. Further, a transmittance for 600-nm light when the thickness of single-crystal diamond material 20 is 500 μm is preferably less than or equal to 60%, is more preferably less than or equal to 30%, and is further preferably less than or equal to 10%, and is particularly preferably less than or equal to 5%. A smaller transmittance indicates a larger number of crystal defect lines 20dq of the invention of the present application and a larger amount of nitrogen defined in the invention of the present application, with the result that crack is suppressed and chipping resistance is exhibited. A smaller transmittance for a longer wavelength indicates a larger number of crystal defect lines of the invention of the present application and a larger amount of nitrogen defined in the invention of the present application, with the result that crack is suppressed and chipping resistance is exhibited. Only with such a multiplicity of crystal defect lines, the transmittance for light does not necessarily have a large influence; however, when the non-substitutional nitrogen is combined with the crystal defect lines, the non-substitutional nitrogen and the crystal defect lines affect the transmittance for light. The transmittance for light in that case serves as a good index for chipping resistance. Here, the "transmittance for light"

refers to a substantial transmittance for incoming light, rather than a transmittance therein excluding reflectance. Hence, even when there is no absorption or scattering, the transmittance will be about 71% at maximum. A converted value of transmittance in the case of a different thickness can be obtained using a generally known formula in consideration of multiple reflections therein.

Method of Producing Single-Crystal Diamond

With reference to FIG. 7, a method of producing single-crystal diamond material 20 of the present embodiment includes: a step (FIG. 7(A)) of preparing diamond seed crystal 10 having seed crystal defect gathered regions in which seed crystal defect points 10dp are gathered at main surface 10m; and a step (FIG. 7(B)) of growing single-crystal diamond material 20 by chemical vapor deposition on main surface 10m of diamond seed crystal 10. The seed crystal defect point refers to a crystal defect point in a seed substrate. The seed crystal defect gathered region refers to a region in which crystal defect points are gathered in the seed substrate. In the seed crystal defect gathered region at the main surface of the above-described diamond seed crystal substrate, groups of seed crystal defect points 10dp are more preferably gathered, seed crystal defect points 10dp are further preferably gathered to extend in the form of lines, and groups of seed crystal defect points 10dp are still more preferably gathered to extend in the form of lines in seed crystal defect points 10dp.

In the method of producing single-crystal diamond 20 of the present embodiment, seed crystal defect points 10dp, the seed crystal defect gathered region, and the seed crystal defect line-like gathered region are shown suitably in an X-ray topography image measured in the transmission type in the direction perpendicular to main surface 10m of diamond seed crystal 10 (i.e., X-ray topography image for main surface 10m of diamond seed crystal 10).

(Diamond having Seed Crystal Defect Gathered Regions)

With reference to FIG. 7(A), the step of preparing diamond seed crystal 10 having seed crystal defect gathered regions in which seed crystal defect points 10dp are gathered at main surface 10m of diamond seed crystal 10 is not particularly limited; however, in order to effectively prepare diamond seed crystal 10 having seed crystal defect line-like gathered regions in which groups of seed crystal defect points 10dp are gathered to extend in a form of lines at main surface 10m of diamond seed crystal 10, the step can includes: a sub step of preparing diamond seed crystal 10; a sub step of forming the seed crystal defect gathered region in which seed crystal defect points 10dp are gathered at main surface 10m of diamond seed crystal 10; and a sub step of forming an ion implantation region 10c at main surface 10m of diamond seed crystal 10 by implanting ions thereinto.

In the step of preparing diamond seed crystal 10, as diamond seed crystal 10, there is prepared a type Ib single-crystal diamond or type IIa single-crystal diamond grown by the high-temperature/high-pressure method, or a single crystal diamond grown by CVD using the type Ib single-crystal diamond or the type IIa single-crystal diamond as a seed crystal.

In the sub step of forming the seed crystal defect gathered regions in which seed crystal defect points 10d are gathered at main surface 10m of diamond seed crystal 10, various types of defect points are included in seed crystal defect points 10dp, such as seed crystal defect points, seed crystal dislocation points 10dd (tip points of dislocations reaching main surface 10m, such as edge dislocations, screw dislocations, and combined dislocations resulting from combinations of at least either of a plurality of edge dislocations and a plurality of screw dislocations), seed crystal chipping points 10dv, seed crystal cracking points, and seed crystal damage points 10di. Moreover, the seed crystal defect gathered region is preferably formed by performing mechanical polishing using a grindstone at a rotation speed of 500 rpm to 3000 rpm and a load of 0.5 kgf to 50 kgf, for example. In the grindstone, diamond abrasive grains having an average grain size of 9 μm to 35 μm are fixed using a metal. The seed crystal defect points are more readily formed in the main surface of the seed crystal as the average grain size is larger, the rotation speed is larger, and the load is larger. The load is preferably more than or equal to 0.5 kgf and less than 5 kgf, is more preferably more than or equal to 5 kgf and less than 10 kgf, is further preferably more than or equal to 10 kgf and less than 20 kgf, and is still more preferably more than or equal to 20 kgf. As the load is larger, a mechanism for suppressing vibration is necessary in order to avoid breakage of a substrate. On the other hand, a high frequency of vibration is permitted. This leads to generation of minute cracks at the surface of the substrate, thus contributing to forming starting points of the groups of crystal defect points of the invention of the present application. When the seed crystal is rotated in the polishing direction, the seed crystal defect points are more likely to be formed to be gathered. On the other hand, when the seed crystal is fixed, the seed crystal defect points are more likely to be formed to be gathered in the form of lines. Since the substrate is broken readily when the load is large, the thickness of the substrate needs to be increased with respect to the size of the substrate. When the load is more than or equal to 0.5 kgf and less than 5 kgf, the size of the substrate is preferably a 4-mm square and the thickness of the substrate is preferably more than or equal to 0.8 mmt. When the load is more than or equal to 5 kgf and less than 20 kgf, the size of the substrate is preferably a 4-mm square and the thickness of the substrate is preferably more than or equal to 1.6 mmt. When the load is more than or equal to 20 kgf, the size of the substrate is preferably a 4-mm square and the thickness of the substrate is preferably more than or equal to 3.2 mmt. By also performing reactive ion etching (RIE), microwave plasma etching, ion milling, or the like after the mechanical polishing, the density of the generated defect points can be finely adjusted and the effect thereof is substantially maintained.

The sub step of forming ion implantation region 10c at the main surface 10m side of diamond seed crystal 10 can be performed by implanting ions into the main surface 10m side of diamond seed crystal 10. For the ions, carbon ions, nitrogen ions, silicon ions, or phosphorus ions are used preferably.

(Step of Growing Single-Crystal Diamond)

With reference to FIG. 7(B), the step of growing single-crystal diamond 20 is performed by growing single-crystal diamond 20 on main surface 10m of diamond seed crystal 10 by chemical vapor deposition (CVD). As the CVD, microwave plasma CVD, DC plasma CVD, hot filament CVD, and the like are used suitably. Using hydrogen, methane, argon, nitrogen, oxygen, carbon dioxide, and the like as single crystal growth gas, the concentration of the non-isolated substitutional nitrogen atoms in the single-crystal diamond (concentration obtained by subtracting the concentration of the isolated substitutional nitrogen atoms from the concentration of all the nitrogen atoms) is preferably adjusted to be more than or equal to 1 ppm, more preferably more than or equal to 5 ppm, and further preferably more than or equal to 8 ppm. Further, a doping gas may be added, such as diborane, trimethylboron, phosphine, tertiary butylphosphorus, or silane. The crystal growth surface of single-crystal diamond 20 preferably has a plane orientation of (100). In a region in which the thickness of single-crystal diamond 20 is 1 μm to 7 μm at the initial stage of the crystal growth, it is preferable to grow it under conditions that at least a growth parameter ($\alpha$) is more than or equal to 2 and the temperature of diamond seed crystal 10 is less than or equal to 1100° C. The growth parameter ($\alpha$) refers to a value obtained by multiplying, by √3, a ratio of the rate of crystal growth in the <100> direction to the rate of crystal growth in the <111> direction.

The thickness of single-crystal diamond 20 to be grown is not particularly limited but is preferably more than or equal to 300 μm and is preferably more than or equal to 500 μm in order to suitably form a cutting tool, a polishing tool, an optical component, an electronic component, a semiconductor material, and the like. The thickness of single-crystal diamond 20 is preferably less than or equal to 3 mm and is preferably less than or equal to 1.5 mm in order to prevent cracks from being generated due to stress with diamond seed crystal 10. In the case of growing single-crystal diamond material 20 having a thickness of more than 1 mm, it is preferable to grow second single-crystal diamond layer 22 on first single-crystal diamond layer 21 as an additional single-crystal diamond material 20 after growing first single-crystal diamond layer 21 having a thickness of less than or equal to 500 μm and then removing diamond seed crystal 10 as described below.

It should be noted that in the case of growing single-crystal diamond 20 including the plurality of single-crystal diamond layers 21, 22 as shown in FIG. 6, first single-crystal diamond layer 21 and the second single-crystal diamond layer can be continuously grown on diamond seed crystal 10 as single-crystal diamond 20. However, in the case of growing single-crystal diamond material 20 having a large thickness (for example, thickness of more than 1 mm), it is preferable that first single-crystal diamond layer 21 having a thickness of less than or equal to 500 μm is grown, then the diamond seed crystal is removed, and then second single-crystal diamond layer 22 is additionally grown, in order to prevent diamond seed crystal 10 from being broken due to stress resulting from the large thickness of single-crystal diamond 20. Between the formation of first single-crystal diamond layer 21 and the formation of second single-crystal diamond layer 22, the environment is returned from a growth environment to a normal atmosphere at a room temperature and then is changed to the growth environment again. Accordingly, the crystal defect lines previously formed in the invention of the present application are more likely to be branched, thus increasing the crystal defect points. Meanwhile, the mechanical polishing in the invention of the present application can also be performed. In that case, single-crystal diamond layer 21 serves as a seed substrate to become a single-crystal diamond seed crystal 10 shown in FIG. 6, thereby achieving growth with an increased number of initial start points.

(Step of Removing Diamond Seed Crystal)

With reference to FIG. 7(C), in order to obtain single-crystal diamond material 20 efficiently, the method of producing single-crystal diamond material 20 of the present embodiment can further include a step of removing diamond seed crystal 10.

In order to remove diamond seed crystal 10 efficiently, in the step of removing diamond seed crystal 10, it is preferable to remove diamond seed crystal 10 by performing electrochemical etching such as electrolytic etching to decompose and remove the conductive layer region of ion implantation region 10c formed by performing ion implantation into diamond seed crystal 10.

(Step of Additionally Growing Single-Crystal Diamond)

With reference to FIG. 7(D), in order to obtain single-crystal diamond 20 in which occurrence of large chipping is further suppressed, the method of producing single-crystal diamond 20 in the present embodiment can further include a step of additionally growing a single-crystal diamond 20.

The step of additionally growing single-crystal diamond 20 is performed by growing second single-crystal diamond layer 22 by CVD on the main surface of first single-crystal diamond layer 21, which is single-crystal diamond 20 having been already grown. In first single-crystal diamond layer 21, crystal defect lines 21dq having defects transferred from seed crystal defect points 10dp of main surface 10m of diamond seed crystal 10 extend in the crystal growth direction as shown in FIG. 7(C). In second single-crystal diamond layer 22 grown by CVD on first single-crystal diamond layer 21, crystal defect points 20dp are tip points of crystal defect lines 22dq that have defects transferred from crystal defect lines 21dq and that extend in the crystal growth direction to reach crystal growth main surface 20m of single-crystal diamond 20.

On this occasion, generally, in first single-crystal diamond layer 21, a plurality of crystal defect lines 21dq are transferred from one seed crystal defect point 10dp of diamond seed crystal 10, and in second single-crystal diamond layer 22, a plurality of crystal defect lines 22dq are transferred from one crystal defect line 21dq of diamond seed crystal 10. Hence, as the number of first and second single-crystal diamond layers 21, 22 are increased, the number of crystal defect points 20dp of single-crystal diamond 20 is increased, thereby further suppressing occurrence of large chipping.

Example 1

(Preparation of Diamond Material for Wire Drawing Die)

1. Preparation of Diamond Seed Crystal Having Seed Crystal Defect Line-Like Gathered Region at Main Surface With reference to FIG. 7(A), as diamond seed crystal 10, a substrate of diamond seed crystal 10 grown by the high-temperature/high-pressure method was prepared. Main surface 10m had an off angle of 2° relative to the (001) plane in the <100> direction, and the size of diamond seed crystal 10 was as follows: 4 mm×4 mm×1 mm in thickness.

By using a grindstone obtained by fixing diamond abrasive grains having an average grain size of 9 μm to 35 μm using a metal, scratches extending in the form of lines in the <100> direction were formed at main surface 10m of diamond seed crystal 10 as the seed crystal defect line-like gathered regions under the following conditions: a rotating speed of 500 rpm to 3000 rpm; and a load falling within a range of 10 kgf to 20 kgf (sample 1). Here, the load was applied in the following manner: the load was gradually increased at a rate of less than or equal to 3 kgf/min while using an apparatus having a mechanism for suppressing vibration of the grindstone to avoid the load from exceeding 52 kgf. Next, the densities of the seed crystal defect points and the seed crystal damage points were adjusted by dry-etching the main surface of the diamond seed crystal using oxygen gas and $CF_4$ gas. It should be noted that the average grain size refers to an average grain size designated by a manufacturer that supplies a diamond grinder, and the average grain size herein refers to an average particle size in the specification of a grinder provided by International Diamond. This is generally determined by screening grains using a sieve, and substantially corresponds to #600 to #1500.

Next, carbon ions were implanted into each diamond seed crystal at the main surface provided with the seed crystal defect line-like gathered regions, with an energy of 300 keV to 10 MeV at an dose amount of $1\times10^{15}$ $cm^{-2}$ to $1\times10^{18}$ $cm^{-2}$, thereby forming a conductive layer region. This step was performed when removing the single-crystal diamond material, grown through chemical vapor deposition, from the seed substrate by electrolytic etching. This step was omitted in the case where the diamond would be sliced by a laser in a subsequent step.

2. Growth of Single-Crystal Diamond

Next, microwave plasma CVD was employed to grow a single-crystal diamond on each diamond seed crystal at its main surface provided with the seed crystal defect line-like gathered regions. For crystal growth gas, hydrogen gas, methane gas, and nitrogen gas were used. The concentration of the methane gas relative to the hydrogen gas was set at 5 mol % to 20 mol %, and the concentration of the nitrogen gas relative to the methane gas was set at 0 mol % to 5 mol %. A crystal growth pressure was set at 5 kPa to 15 kPa, and a crystal growth temperature (temperature of the diamond seed crystal) was set at 800° C. to 1200° C.

3. Removal of Diamond Seed Crystal

Next, respective single-crystal diamonds were removed from the diamond seed crystals by performing electrolytic etching to decompose the conductive layer regions in the diamond seed crystals. Alternatively, in the case where no ion implantation had been performed, slicing was performed using a laser to remove them from the seed substrate.

As a result of evaluating each of the removed single-crystal diamonds, the density of the crystal defect points was 1200 mm$^{-2}$, the density of the combined dislocations was 400 mm$^{-2}$, the number of single-crystal diamond layers was two, the thickness of the single-crystal diamond was 1.0 mm, and the concentration of the non-substitutional nitrogen atoms (non-isolated substitutional nitrogen atoms) was 35 ppm. The density of the crystal defect points and the density of the combined dislocations were measured as described in the section [Crystal Defect]. It should be noted that the density of the combined dislocations is a density thereof at the crystal growth surface, and is measured as a density of points at which dislocations reach the surface.

The single-crystal diamond was machined into a shape of cutter edge, and was used to cut a workpiece for the purpose of evaluation of chipping resistance. Table 1 shows a series of evaluations and conditions.

TABLE 1

| | | Sample 1 |
|---|---|---|
| Seed Crystal | Type of Seed Crystal (Single Crystal Synthesis Method) | HPHT Method (Type Ib) |
| | Off Angle (°) | 2 |
| | Off Direction | <100> |
| | Load (kgf) during Polishing | 10 to 20 |
| | Manner of Selecting Polishing Direction during Polishing | Rotation → Fixation |
| | State of Defect Points in Crystal Defect Gathered Region | Gathered in the form of Lines |
| | Density of Seed Crystal Defect Points (mm$^{-2}$) | 170 |
| | Thickness of Seed Crystal Diamond (mm) | 1 |
| | Seed Substrate Size (mm$^2$) | 4 × 4 |
| Single Crystal | State of Defect Points in Crystal Defect Gathered Region | Groups Gathered in the form of Lines |
| | Number of Groups in parallel in the form of Lines | 25 |
| | Density of Crystal Defect Points (mm$^{-2}$) | 1200 |
| | Density of Combined Dislocations (mm$^{-2}$) | 400 |
| | Number of Single-Crystal Diamond Layers | 2 |
| | Thickness of Single-Crystal Diamond (μm) | 1 |
| | Concentration of Non-Substitutional Nitrogen Atoms (ppm) | 35 |
| | Concentration of Substitutional Nitrogen Atoms (ppm) | 0.6 |
| | Total Nitrogen Concentration (ppm) | 35.6 |
| | Transmittance (%) for Wavelength of 400 nm (Converted into Thickness of 500 μm) | 8 |
| | Transmittance (%) for Wavelength of 600 nm (Converted into Thickness of 500 μm) | 53 |
| | Chipping Resistance A (Number of Chippings) | 0 |
| | Chipping Resistance B (Number of Chippings) | 1 |

Here, for the polishing, attention was paid to selection of polishing directions, and therefore Table 1 shows the polishing directions distinctively. In Table 1, "Rotation→Fixation" indicates a method in which a substrate made relatively flat by a general method is polished for 2 hours while being rotated (turned) and then is fixed and polished for 1 hour. With this, defects are likely to be introduced in the form of lines.

For a cutter, RF 4080R provided by Sumitomo Electric Industries HardMetal was used. For a wiper chip, SNEW 1204ADFR-WS provided by Sumitomo Electric Industries HardMetal was used. As a lathe, NV 5000 provided by MORI SEIKI was used. A cutting speed was set at 2000 m/min, an amount of cut was set at 0.05 mm, and an amount of feed was set at 0.05 mm/cutting edge. For the workpiece, an aluminum material A5052 was used. After cutting the workpiece for 30 km, a chipping resistance evaluation ("Chipping Resistance A (Number of Chippings)" in Table 1) was performed based on the number of chippings of more than or equal to 5 μm in the cutter edge. As a result, the number of chippings was zero, and therefore the single-crystal diamond was very excellent. For different, severer conditions, a cutting speed was set at 2000 m/min, an amount of cut was set at 0.10 mm, and an amount of feed was set at 0.10 mm/cutting edge. For the workpiece, an aluminum material A5052 was used. After cutting the workpiece for 30 km, a chipping resistance evaluation ("Chipping Resistance B (Number of Chippings)" in Table 1) was performed based on the number of chippings of more than or equal to 5 μm in the cutter edge. As a result, excellent chipping resistance was resulted.

In chipping resistance evaluation A, when the number of chippings was less than or equal to one, the material was sufficiently usable as a product. In severer evaluation B, less than five chippings were permitted.

The grown surface of the above-described single-crystal diamond was polished to be flat and was subjected to an evaluation. The evaluation result presented the same values as the values before the polishing. Specifically, in the evaluation after the polishing, the density of the crystal defect points was 1200 mm$^{-2}$, the density of the combined dislocations was 400 mm$^{-2}$, the number of single-crystal diamond layers was two, the thickness of the single-crystal diamond was 1.0 mm, and the concentration of the non-substitutional nitrogen atoms (non-isolated substitutional nitrogen atoms) was 35 ppm. For each of the single-crystal diamond materials, the ion implantation and electrolytic etching were performed in the step of removing from the seed substrate;

however, there was no large difference in evaluation results when employing the method of slicing using a laser. In the method of slicing using the laser, after the evaluations, mechanical polishing was performed to form a normal flat surface, and then the next die chip formation was performed.

This plate was cut by a laser into a desired size, thereby obtaining a chip for a wire drawing die. Then, a wire drawing die was produced. Then, the wire drawing die was evaluated.

(Preparation and Evaluation of Wire Drawing Die)

Figure 8:
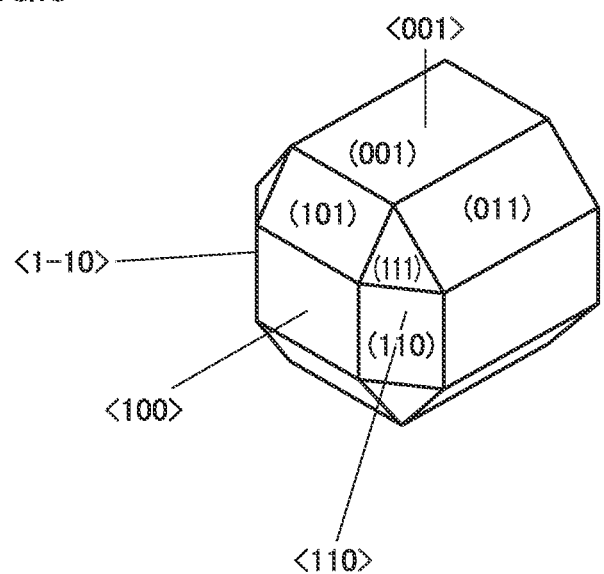
FIG. 8 is a perspective view showing an arrangement of crystal planes.
Figure 9:
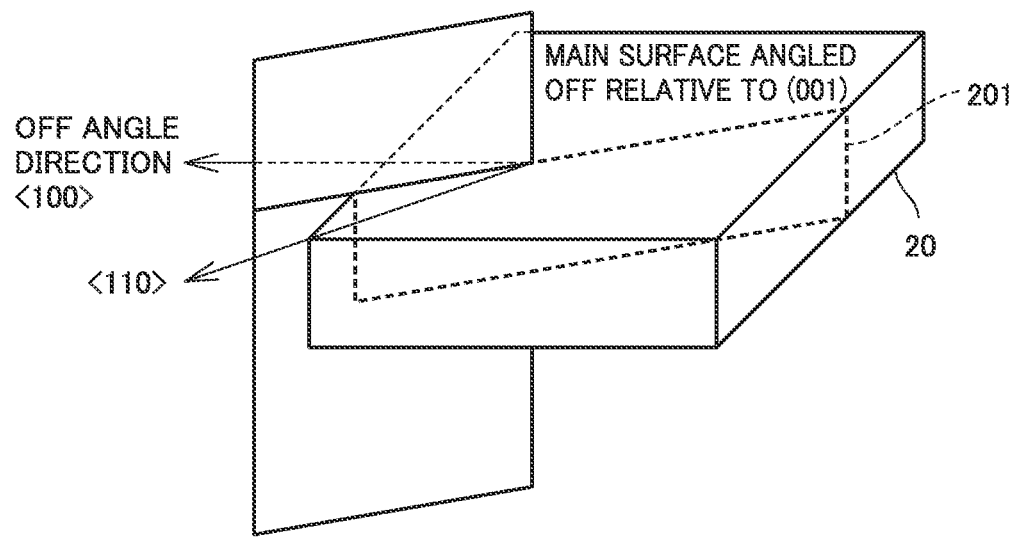
FIG. 9 is a perspective view of a single-crystal diamond 20 to illustrate a cut surface 201.
Figure 10:
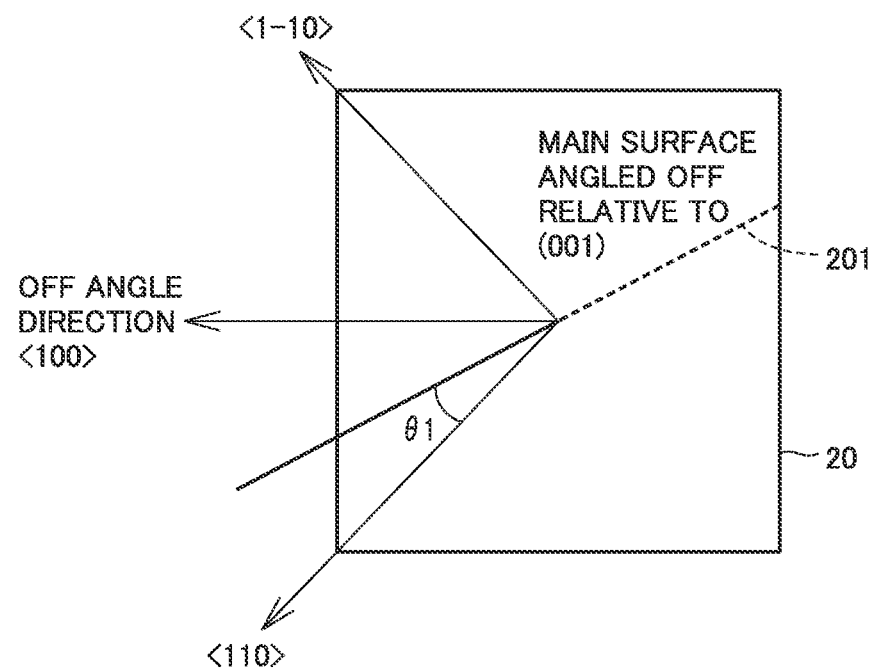
FIG. 10 is a plan view of single-crystal diamond 20 to illustrate cut surface 201.

The CVD single-crystal diamond (sample 1) produced by the above-described method was used to prepare samples of diamond dies each having the shape shown in FIG. 1 to FIG. 3. As shown in FIG. 8 to FIG. 10, in the formation of each of the dies, the die is prepared by cutting single-crystal diamond 20 into a rectangular parallelepiped in the following manner: single-crystal diamond 20 is cut perpendicular to the main surface having an off angle of 2° relative to the <001> direction and in a direction inclined by an angle θ1 (0.5°, 1.2°, 6.2°, and 7.3°) relative to the parallelism of the <110> direction in the <100> direction within the main surface, such that a resulting cut surface 201 serves as a main surface in which a hole of the die is to be formed (the hole is to be formed perpendicular to this main surface). As a result, the inclination angles of the axes of the holes are respectively 1.9°, 2.6°, 7.6°, and 8.7° relative to the <1-10> direction.

Moreover, for comparison with the above-described CVD single-crystal diamond, diamond samples produced using a natural diamond and a high-pressure synthesis single-crystal diamond were prepared. Details of these samples are shown below.

TABLE 2

| Sample No. | Material | Crystal Plane | Inclination Angle of Axis of Hole (°) | Die Hole Diameter D (μm) | Bearing Length | Reduction Angle (°) |
|---|---|---|---|---|---|---|
| 1 | CVD Single-Crystal Diamond | (110) | 1.9 | 17.5 | 40 to 60% D | 10 to 12 |
| 2 | | | 2.6 | | | |
| 3 | | | 7.6 | | | |
| 4 | | | 8.7 | | | |
| 5 | Natural Single-Crystal Diamond (ND) | (111) | 10.4 | | | |
| 6 | High-Pressure Synthesis Single-Crystal Diamond (HPHT) | | 0.5 | | | |

Figure 11:
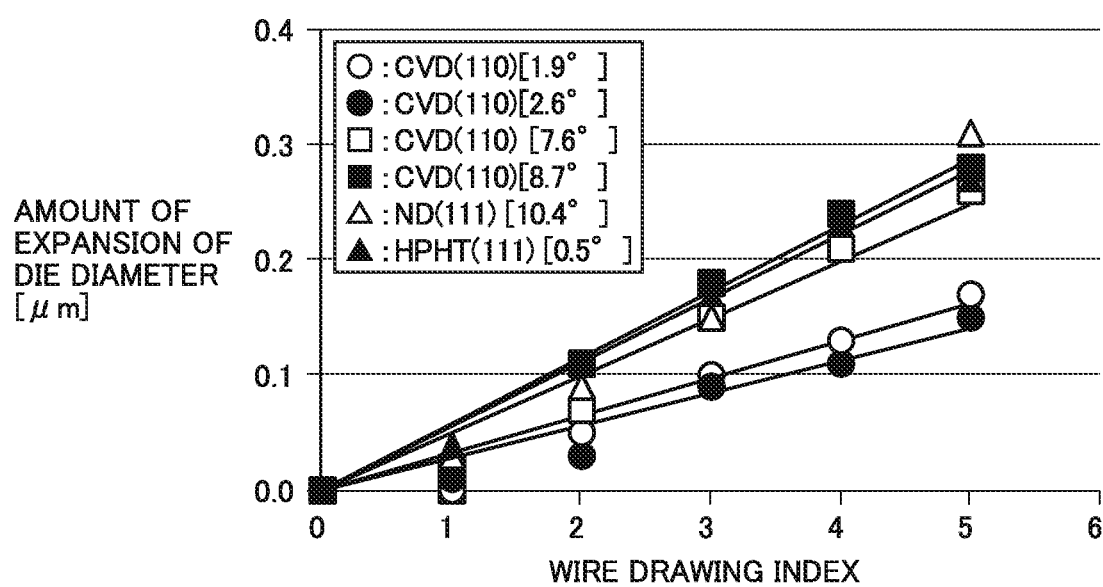
FIG. 11 is a graph showing changes of diameters of holes with respect to wire drawing distances when wire drawing is performed using a product of a diamond die of the present invention and a comparative product of a diamond die.
Figure 12:
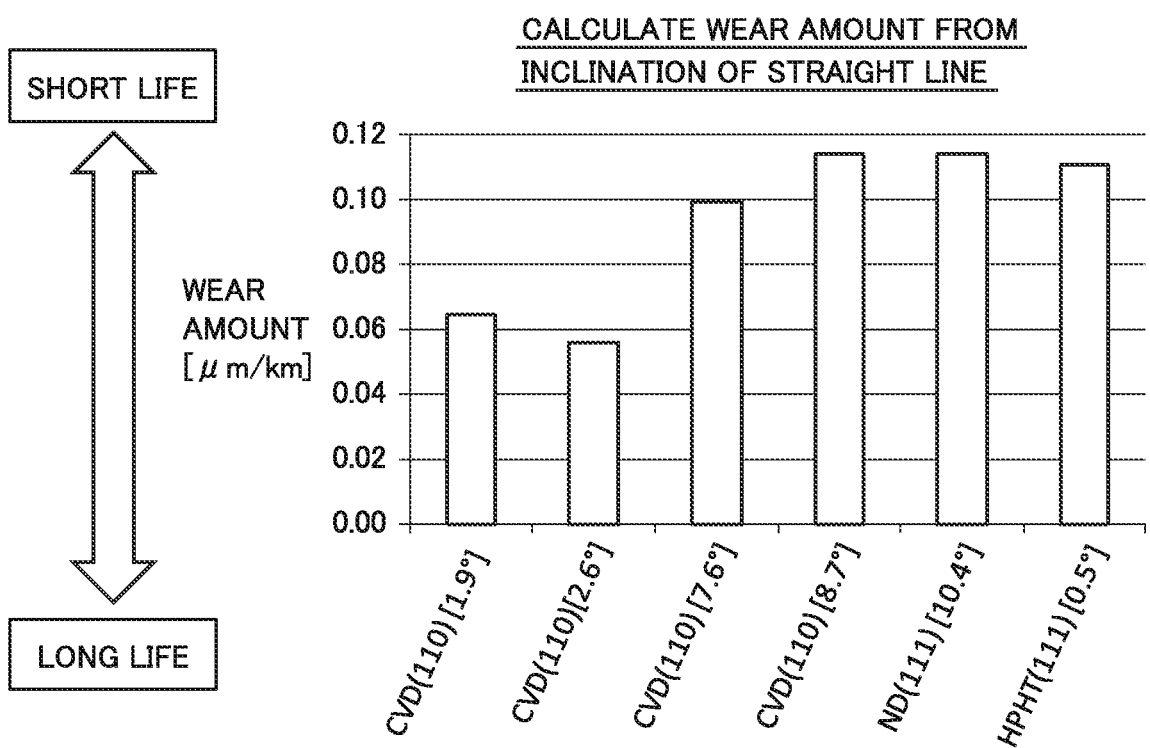
FIG. 12 is a graph showing wear amounts when wire drawing is performed using the product of the diamond die of the present invention and the comparative product of the diamond die.
Figure 13:
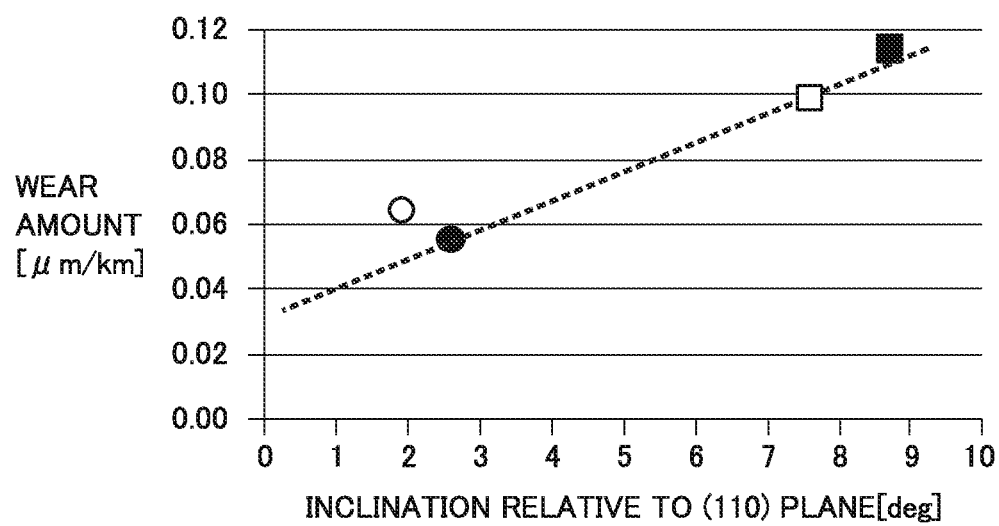
FIG. 13 is a graph showing a change of wear amount with respect to an inclination relative to a (110) plane in the product of the diamond die of the present invention.

Wire drawing was performed under the following conditions using the dies of samples No. 1 to No. 6 above.
Area reduction ratio: 13%
Wire drawing speed: 500 m/min
Wire material: SUS 304
Lubricant: synthetic oil based lubricant
After the wire drawing, an amount of expansion of the hole of each of the dies was measured. FIG. 11 to FIG. 13 show a result thereof.

As shown in FIG. 11 to FIG. 13, it is understood that wear resistance is more excellent as the inclination relative to the (110) plane is smaller. Further, it is understood that when the inclination is less than or equal to 8°, wear resistance more than or equal to that of the single-crystal diamond die of the comparative example is exhibited.

In the wire drawing index on the upper left graph, 1 represents a wire drawing distance of 0.5 km.

In the lower left graph, the amount of expansion of the diameter of the hole of the die when wire drawing is performed for 1 km is shown as a wear amount.

In the dies of samples No. 1 to No. 4 (CVD single-crystal diamond; the upper and lower surfaces correspond to the (110) plane) serving as the products of the present invention, the inclination angles were 0.1° to 15° and wear causing partial removal was not observed. As the inclination angle is smaller, wear is less. In the die of sample No. 6 serving as the comparative example (high-pressure synthesis single-crystal diamond (HPHT); the upper and lower surfaces correspond to the (111) plane), the wear amount was larger than that of each of the products of the present invention. In the die of sample No. 5 serving as the comparative example (natural single-crystal diamond (ND); the upper and lower surfaces correspond to the (111) plane), the wear amount was larger than that of the product of the present invention. In the product with an inclination angle of 10.4°, wear causing partial removal was observed.

It should be noted that although not shown in this Example, in another die (high-pressure synthesis single-crystal diamond (HPHT); the upper and lower surfaces correspond to the (110) plane), the wear amount is substantially comparable to that of each of the products of the present invention; however, since it is difficult to produce a diamond having upper and lower surfaces corresponding to the (110) plane, cost is increased.

Example 2

(Preparation of Diamond Material for Wire Drawing Die)

TABLE 3

| | | Sample 11 | Sample 12 | Sample 13 | Sample 14 | Sample 15 | Sample 16 |
|---|---|---|---|---|---|---|---|
| Seed Crystal | Type of Seed Crystal (Single Crystal Synthesis Method) | HPHT Method (Type IIa) | HPHT Method (Type IIa) | HPHT Method (Type Ib) | HPHT Method (Type Ib) | HPHT Method (Type Ib) | HPHT Method (Type Ib) |
| | Off Angle (°) | 2 | 3 | 3 | 3 | 5 | 3 |
| | Direction of Off Angle | <110> | <110> | <110> | <110> | <110> | <110> |
| | Load (kgf) during Polishing | 5 to 10 | 10 to 20 | 15 to 25 | 20 to 30 | 10 to 20 | 30 to 50 |
| | Manner of Selecting Polishing Direction during Polishing | Fixation → Rotation | Fixation → Rotation | Fixation → Rotation | Fixation → Rotation | Rotation → Fixation | Rotation → Fixation |
| | State of Defect Points in Crystal Defect Gathered Region | Gathered | Gathered | Gathered | Gathered | Gathered in the form of Lines | Gathered in the form of Lines |
| | Density of Seed Crystal Defect Points (mm$^{-2}$) | 1 | 3 | 21 | 21 | 130 | 450 |
| | Thickness of Seed Crystal Diamond (mm) | 1.6 | 1.8 | 3.2 | 3.5 | 1.7 | 3.5 |
| | Seed Substrate Size (mm$^2$) | 4 × 4 | 4 × 4 | 4 × 4 | 4 × 4 | 4 × 4 | 4 × 4 |

TABLE 3-continued

|  |  | Sample 17 | Sample 18 | Sample 19 | Sample 20 | Sample 21 |
|---|---|---|---|---|---|---|
| Seed Crystal | Type of Seed Crystal (Single Crystal Synthesis Method) | CVD Method | CVD Method | CVD Method | CVD Method | CVD Method |
|  | Off Angle (°) | 2 | 5 | 8 | 15 | 3 |
|  | Direction of Off Angle | <110> | <110> | <110> | <110> | <110> |
|  | Load (kgf) during Polishing | 10 to 20 | 10 to 20 | 20 to 30 | 20 to 30 | Not Polished |
|  | Manner of Selecting Polishing Direction during Polishing | Fixation → Rotation | Fixation → Rotation | Rotation → Fixation | Rotation → Fixation | Not Polished |
|  | State of Defect Points in Crystal Defect Gathered Region | Groups Gathered | Groups Gathered | Groups Gathered in the form of Lines | Groups Gathered in the form of Lines | Groups Gathered in the form of Lines |
|  | Density of Seed Crystal Defect Points ($mm^{-2}$) | 1500 | 2100 | 3100 | 3400 | 230 |
|  | Thickness of Seed Crystal Diamond (mm) | 1.6 | 1.6 | 3.2 | 3.2 | 0.7 |
|  | Seed Substrate Size ($mm^2$) | 4 × 4 | 4 × 4 | 4 × 4 | 4 × 4 | 4 × 4 |

TABLE 4

|  |  | Sample 11 | Sample 12 | Sample 13 | Sample 14 | Sample 15 | Sample 16 |
|---|---|---|---|---|---|---|---|
| Single Crystal | State of Defect Points in Crystal Defect Gathered Region | Groups Gathered | Groups Gathered | Groups Gathered | Groups Gathered | Groups Gathered in the form of Lines | Groups Gathered in the form of Lines |
|  | Number of Groups in parallel in the form of Lines (in Substrate) | — | — | — | — | 23 | 95 |
|  | Density of Crystal Defect Points ($mm^{-2}$) | 2 | 22 | 90 | 310 | 1100 | 7500 |
|  | Density of Combined Dislocations ($mm^{-2}$) | 0 | 5 | 22 | 80 | 320 | 2800 |
|  | Number of Single-Crystal Diamond Layers | 1 | 1 | 1 | 1 | 1 | 1 |
|  | Thickness of Single-Crystal Diamond (μm) | 0.6 | 0.7 | 0.8 | 0.9 | 0.8 | 1.1 |
|  | Concentration of Non-Substitutional Nitrogen Atoms (ppm) | 1.1 | 3.3 | 5.8 | 9.6 | 44.4 | 19.7 |
|  | Concentration of Substitutional Nitrogen (ppm) | 0.1 | 0.2 | 0.2 | 0.4 | 0.6 | 0.3 |
|  | Total Nitrogen Concentration (ppm) | 1.2 | 3.5 | 6 | 10 | 45 | 20 |
|  | Transmittance (%) for Wavelength of 400 nm (Converted Into Thickness of 500 μm) | 57 | 43 | 26 | 14 | 7 | 9 |
|  | Transmittance (%) for Wavelength of 600 nm (Converted into Thickness of 500 μm) | 68 | 64 | 58 | 53 | 48 | 45 |
|  | Chipping Resistance A (Number of Chippings) | 1 | 1 | 0 | 0 | 0 | 0 |
|  | Chipping Resistance B (Number of Chippings) | 3 | 3 | 2 | 2 | 1 | 1 |

|  |  | Sample 17 | Sample 18 | Sample 19 | Sample 20 | Sample 21 |
|---|---|---|---|---|---|---|
| Single Crystal | State of Defect Points in Crystal Defect Gathered Region | Groups Gathered in the form of Lines | Groups Gathered in the form of Lines | Groups Gathered in the form of Lines | Groups Gathered in the form of Lines | Groups Gathered in the form of Lines |
|  | Number of Groups in parallel in the form of Lines (in Substrate) | 120 | 180 | 310 | 300 | 18 |

TABLE 4-continued

|  | | | | | |
| --- | --- | --- | --- | --- | --- |
| Density of Crystal Defect Points ($mm^{-2}$) | 14000 | 23000 | 50000 | 51000 | 1900 |
| Density of Combined Dislocations ($mm^{-2}$) | 5500 | 9600 | 23000 | 21000 | 850 |
| Number of Single-Crystal Diamond Layers | 2 | 3 | 3 | 3 | 2 |
| Thickness of Single-Crystal Diamond (μm) | 1.2 | 1.1 | 1.1 | 1.1 | 1.2 |
| Concentration of Non-Substitutional Nitrogen Atoms (ppm) | 31 | 49.55 | 109 | 190 | 24.8 |
| Concentration of Substitutional Nitrogen (ppm) | 0.1 | 0.45 | 1 | 9 | 0.2 |
| Total Nitrogen Concentration (ppm) | 31.1 | 50 | 111 | 199 | 25 |
| Transmittance (%) for Wavelength of 400 nm (Converted Into Thickness of 500 μm) | <1 | <1 | <1 | <1 | 4 |
| Transmittance (%) for Wavelength of 600 nm (Converted into Thickness of 500 μm) | 28 | 8 | 4 | 2 | 38 |
| Chipping Resistance A (Number of Chippings) | 0 | 0 | 0 | 0 | 0 |
| Chipping Resistance B (Number of Chippings) | 0 | 0 | 0 | 0 | 0 |

In a procedure similar to that in Example 1, slightly different samples (sample 11 to sample 21) were prepared. Here, diamond seed crystal substrates were prepared which had main surfaces having off angles of 2° to 15° relative to the (001) plane in the <1-10> direction, had an area of 4 mm×4 mm, and had a thickness of 0.7 to 3.5 mm. The inclination angles of the axes of the holes coincided with the off angles of the seed substrates of Table 3. Conditions of the preparation of the seed substrates were the same as the conditions shown in Example 1 except those shown in Table 3. Single crystals shown in Table 4 were obtained.

The meaning of "Rotation→Fixation" in Table 3 is the same as the meaning described in Table 1. "Fixation→Rotation" indicates a method in which a substrate made relatively flat by a general method is fixed and polished for 1 hour and then is polished for 2 hours while being rotated. With this, defects gathered not in the form of lines are likely to be introduced. The loads during the polishing in Table 1 are loads in the cases of "Rotation→Fixation" and "Fixation→Rotation". Since the AsGrown surface of a substrate formed by CVD is smooth, single-crystal diamonds can be grown thereon without polishing. Hence, an experiment was also conducted with regard to a seed substrate not polished (sample 21). In each of Table 3 and Table 4, the expression "Groups Gathered" indicates that the areas of groups are in contact with or overlap with one another and are connected to one another. The expression "Groups Gathered in the Form of Lines" indicates that groups are gathered to be connected to one another in the form of elongated lines. The expression "Groups" refers to a collection of crystal defect points that are based on crystal defect lines branched from the same starting point. The expression "Crystal Defect Points of Seed Crystal" refers to a combination of starting points of groups of crystal defect lines of a single-crystal layer and starting points of crystal defect lines that are not in groups. The expression "Gathered" indicates that when 70% of defect points in a specific range are collected, a total of defect point ranges can be limited to be in less than or equal to 50% of the area of the specific range. Regarding the defect point ranges, a range of one defect point is a range having a radius represented by a distance to the closest defect point. The expression "Interspersed" refers to a state in which there is no gathering defined as above.

(Preliminary Evaluation)

Single-crystal diamond 20 was machined into a shape of cutter edge, and was used to cut a workpiece for the purpose of evaluation of chipping resistance. For a cutter, RF 4080R provided by Sumitomo Electric Industries HardMetal was used. For a wiper chip, SNEW 1204ADFR-WS provided by Sumitomo Electric Industries HardMetal was used. As a lathe, NV 5000 provided by MOM SEIKI was used. A cutting speed was set at 2000 m/min, an amount of cut was set at 0.05 mm, and an amount of feed was set at 0.05 mm/cutting edge. For the workpiece, an aluminum material A5052 was used. After cutting the workpiece for 30 km, a chipping resistance evaluation (evaluation A) was performed based on the number of chippings of more than or equal to 5 μm in the cutter edge. For different, severer conditions, a cutting speed was set at 2000 m/min, an amount of cut was set at 0.10 mm, and an amount of feed was set at 0.10 mm/cutting edge. For the workpiece, an aluminum material A5052 was used. After cutting the workpiece for 30 km, a chipping resistance evaluation (evaluation B) was performed based on the number of chippings of more than or equal to 5 μm in the cutter edge. A result thereof is shown in the lowermost part of Table 4.

(Preparation and Evaluation of Wire Drawing Die)

Figure 14:
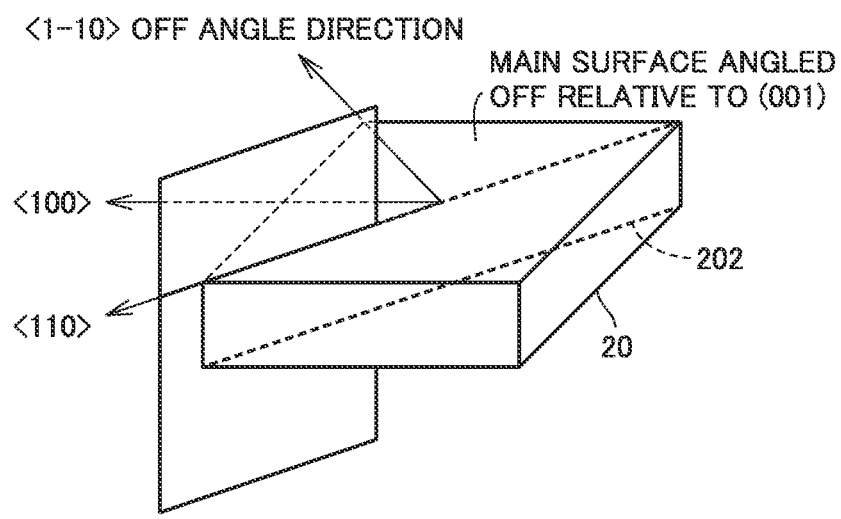
FIG. 14 is a perspective view of a single-crystal diamond 20 to illustrate a cut surface 202.
Figure 15:
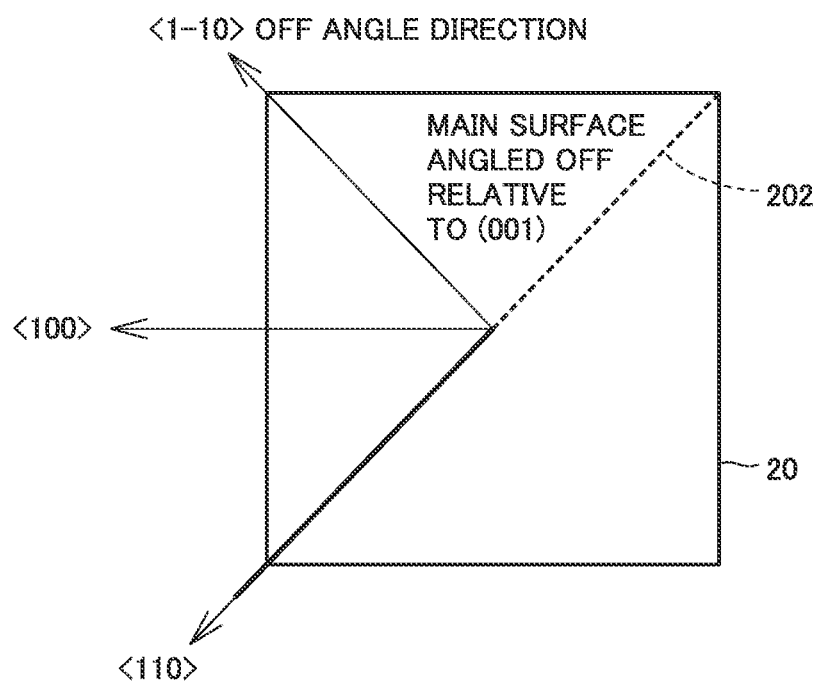
FIG. 15 is a plan view of a single-crystal diamond 20 to illustrate a cut surface 202.

The CVD single-crystal diamonds (sample 11 to sample 21) produced by the above-described method were used to prepare samples of diamond dies each having the shape shown in FIG. 1 to FIG. 3 in the same manner as in Example 1. In each of the dies, as shown in FIG. 14 and FIG. 15, single-crystal diamond 20 was cut perpendicular to the main surface thereof having an off angle relative to the <001> direction and is cut parallel to the <110> direction. For preparation, single-crystal diamond 20 was cut into a rectangular parallelepiped such that a resulting cut surface 202 serves as a main surface in which hole 14 of the die is to be formed (upper surface 5 and lower surface 6; hole 14 is formed perpendicular to this main surface). Hence, each of die samples A11 to A21 was produced such that the inclination angle of the axis of the hole coincided with the off angle of the seed substrate of Table 3 relative to the <1-10> direction. Die samples A11 to A21 are constituted of samples 11 to 21.

Moreover, in the case of forming dies each having upper and lower surfaces corresponding to substantially the (001) plane and provided with a hole having an axis, using sample 12, sample 17, sample 20, and sample 21, each of single-crystal diamonds was cut into a rectangular parallelepiped to have a main surface having an off angle relative to the <001> direction serving as a main surface in which the hole of the die was to be formed (the hole was to be formed perpendicular to this main surface). The inclination angle of the axis of the hole in this case coincides with the off angle relative to the (001) plane in Table 3 (die samples B12, B17, B20, B21). Die samples B12, B17, B20, B21 are constituted of samples 12, 17, 20, 21.

Figure 16:
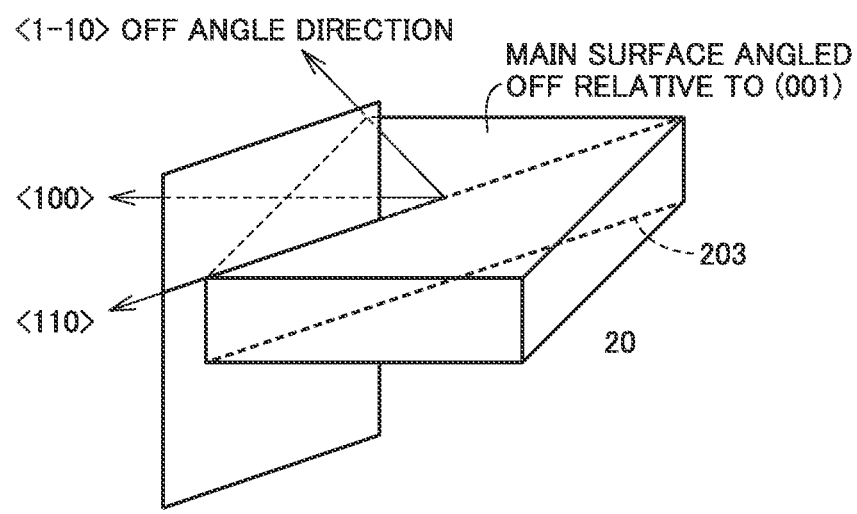
FIG. 16 is a perspective view of a single-crystal diamond 20 to illustrate a cut surface 203.
Figure 17:
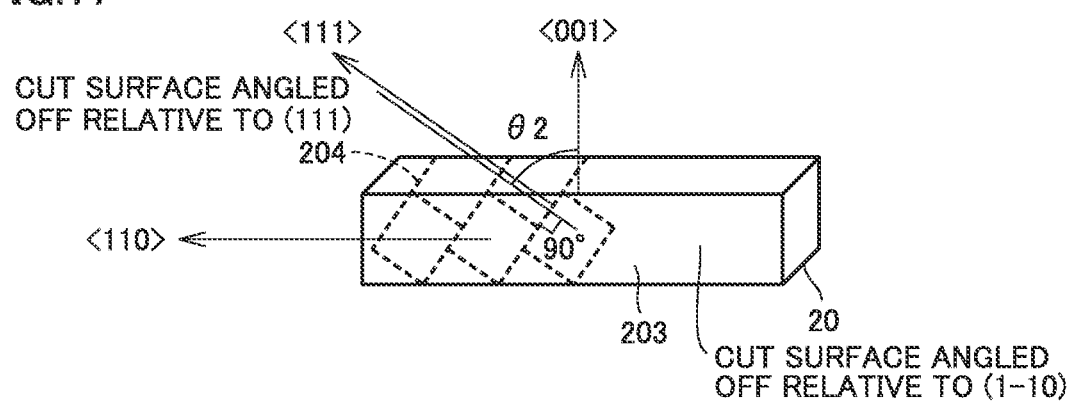
FIG. 17 is a perspective view of a single-crystal diamond 20 to illustrate a cut surface 203.

Meanwhile, in the case of forming dies each having upper and lower surfaces corresponding to substantially the (111) plane and provided with a hole having an axis, using sample 13, sample 18, and sample 19, each of single-crystal diamonds 20 was cut perpendicular to the main surface having an off angle relative to the <001> direction and parallel to the <110> direction as shown in FIG. 16 and was cut perpendicular to a resulting cut surface 203 and perpendicular to a direction obtained by rotating from the <001> direction to the <110> direction by θ2 (54.7°: (1-10) in-plane angle) as shown in FIG. 17. Since single-crystal diamonds 20 were cut into rectangular parallelepipeds such that resulting cut surfaces serve as main surfaces in which the holes of the dies were to be formed (holes were formed perpendicular to these main surfaces), the inclination angles of the axes of the holes were 1.7°, 2.9°, and 4.6° relative to the (111) plane (die samples C13, C18, C19). Die samples C13, C18, C19 are constituted of samples 13, 18, 19. Samples with small chipping resistances in the preliminary evaluation, i.e., samples with more than or equal to five chippings in evaluation A were chipped when producing diamond dies, with the result that the dies could not be produced; however, each of the samples of die samples A11 to A21 of the present example exhibited a wear resistance comparable to those of samples 1 to 4 of Table 2 of Example 1. Each of die samples B12, B17, B20, B21, C13, C18, C19 of the present example had a wear amount smaller than those of samples 5 and 6 of Table 2 of Example 1.

The metal portion of each die was melted to remove the single-crystal diamond. The single-crystal diamond tip provided with the hole was evaluated in transmittance or the like by using X-ray topography, SIMS, ESR, and microscope. As a result, it could be confirmed that the die produced from the diamond single crystal had the original characteristics of Table 1 and Table 4. Hole axis and crystal plane orientation were confirmed and evaluated using X-ray diffraction with the chip being fixed to a substrate such that a perpendicular direction corresponds to a direction in which a plurality of outlines of the hole when viewed in the hole axis direction using a microscope (outlines of the outermost circle in which the hole crosses the rectangular parallelepiped of the chip, the innermost circle that can be confirmed as the minimum diameter in the hole, and the like) are concentric. The evaluation with the X rays was performed in the same manner as that in a general method of evaluating fluctuation, off angle, or pole figure of crystal of a plate-like single crystal. Since the perpendicular direction of the substrate coincides with the direction of the axis of the hole, the inclination angle of the axis of the hole can be confirmed.

The embodiments and examples disclosed herein are illustrative and non-restrictive in any respect. The scope of the present invention is defined by the terms of the claims, rather than the embodiments described above, and is intended to include any modifications within the scope and meaning equivalent to the terms of the claims.

REFERENCE SIGNS LIST

1: diamond; 1a: bell portion; 1b: approach portion; 1c: reduction portion; 1d: bearing portion; 1e: back relief portion; 1f: exit portion; 2: sintered alloy; 3: case; 4: diamond die; 5: first surface; 6: second surface; 11: inlet; 12: outlet; 13: side wall; 14: hole; 15: axis.

The invention claimed is:

1. A diamond die comprising a diamond provided with a hole for drawing a wire material,
the diamond being a CVD single-crystal diamond,
an axis of the hole being inclined relative to a normal direction of a crystal plane of the diamond,
the diamond having an upper and lower surface and being provided with the hole extending from the upper surface to the lower surface and being formed perpendicular to the upper surface and lower surface,
the upper and lower surfaces of the diamond being inclined relative to a (110) plane by 1° to 15°.

2. The diamond die according to claim 1, wherein
the hole includes a reduction portion, a bearing portion having a diameter D, a back relief portion, and an exit portion in a direction from an upstream side to a downstream side of flow of the wire material so as to define the hole, and
a length of the bearing portion is more than or equal to 0.4 D and less than or equal to 1.5 D in a shape of the hole in a cross section along the axis of the hole.

3. The diamond die according to claim 2, wherein the diameter D is less than 50 μm, and a cross sectional shape of the hole from the back relief portion to the exit portion is a recessed curve shape.

4. The diamond die according to claim 1, wherein the diamond die is used with an area reduction ratio of more than or equal to 8% and less than or equal to 25% during a wire drawing.

5. The diamond die according to claim 1, wherein the CVD single-crystal diamond is used for the diamond, and in an X-ray topography image for a crystal growth main surface of the single-crystal diamond, groups of crystal defect points are gathered, each of the crystal defect points being a tip point of a crystal defect line reaching the crystal growth main surface, the crystal defect line representing a line in which a crystal defect exists, and a density of the crystal defect points is more than 2 mm$^{-2}$.

6. The diamond die according to claim 5, wherein a density of combined dislocation points of the crystal defect points is more than 2 mm$^{-2}$ each of the combined dislocation points being a tip point of a combined dislocation reaching the crystal growth main surface, the combined dislocation resulting from a combination of at least either of a plurality of edge dislocations and a plurality of screw dislocations.

7. The diamond die according to claim 5, wherein the diamond includes two main surfaces and a plurality of single-crystal diamond layers located between the two main surfaces, and the crystal defect line is branched into a plurality of crystal defect lines at a boundary between the two single-crystal diamond layers to increase the number of the crystal defect lines toward one of the main surfaces.

8. The diamond die according to claim 5, wherein a plurality of crystal defect line-shaped gathered regions exist in parallel, and in the plurality of crystal defect line-shaped gathered regions, groups of the crystal defect points extend in a form of lines.

9. The diamond die according to claim 5, wherein more than or equal to 1 ppm of nitrogen atoms are contained as impurity atoms in the single-crystal diamond, and the nitrogen atoms are nitrogen atoms other than isolated substitutional nitrogen atoms.

10. The diamond die according to claim 5, wherein a transmittance for 400-nm light is less than or equal to 60% when a thickness of the single-crystal diamond is measured to be 500 μm or is converted into 500 μm.

11. The diamond die according to claim 1, wherein the axis of the hole is inclined relative to a <110> direction of the diamond by 1° to 15°.

* * * * *